(12) United States Patent
Kirkpatrick

(10) Patent No.: US 10,209,617 B2
(45) Date of Patent: Feb. 19, 2019

(54) TREATMENT METHOD FOR DEFECT REDUCTION IN A SUBSTRATE AND SUBSTRATES TREATED THEREBY

(71) Applicant: Exogenesis Corporation, Billerica, MA (US)

(72) Inventor: Sean R. Kirkpatrick, Littleton, MA (US)

(73) Assignee: EXOGENESIS CORPORATION, Billerica, MA (US)

(*) Notice: Subject to any disclaimer, the term of this patent is extended or adjusted under 35 U.S.C. 154(b) by 0 days.

(21) Appl. No.: 15/403,964

(22) Filed: Jan. 11, 2017

(65) Prior Publication Data

US 2017/0123309 A1    May 4, 2017

Related U.S. Application Data

(60) Continuation of application No. 14/496,412, filed on Sep. 25, 2014, which is a division of application No.
(Continued)

(51) Int. Cl.
*H01J 37/05*    (2006.01)
*G03F 1/80*    (2012.01)
(Continued)

(52) U.S. Cl.
CPC .................. *G03F 1/80* (2013.01); *G03F 1/82* (2013.01); *H01J 37/05* (2013.01); *H01J 37/147* (2013.01); *H01J 37/317* (2013.01); *H01J 37/3171* (2013.01); *H01L 21/02115* (2013.01); *H01L 21/02274* (2013.01); *H01L 21/26506* (2013.01); *H01L 21/26513* (2013.01); *H01L 21/26566* (2013.01); *H01L 21/31105* (2013.01); *H01L 21/31111* (2013.01); *H05H 3/02* (2013.01); *B24B 37/04* (2013.01);
(Continued)

(58) Field of Classification Search
CPC ... H01J 37/05; H01J 37/317; H01J 2237/0812
USPC .................................... 250/251, 492.1–492.3
See application file for complete search history.

(56) References Cited

U.S. PATENT DOCUMENTS 4,649,273 A    3/1987  Chutjian
4,713,542 A *  12/1987  Campana .................. G21K 1/14
                                                         250/251
(Continued)

FOREIGN PATENT DOCUMENTS

CN    102290346 A    11/2011
JP    2005289762     10/2005
(Continued)

OTHER PUBLICATIONS

Kirkpatrick "Gas Cluster Ion Beam applications and equipment" Nuclear Instruments & Methods in Physics Research B 206:830-837 (2003).
(Continued)

*Primary Examiner* — Michael Maskell
(74) *Attorney, Agent, or Firm* — Burns & Levinson LLP; Jerry Cohen; David W. Gomes

(57) ABSTRACT

A method for treating a substrate surface uses Neutral Beam irradiation derived from a gas-cluster ion-beam and articles produced thereby including lithography photomask substrates.

22 Claims, 11 Drawing Sheets

Related U.S. Application Data

13/215,514, filed on Aug. 23, 2011, now Pat. No. 8,847,148, application No. 15/403,964, filed on Jan. 11, 2017, which is a continuation of application No. 14/768,899, filed as application No. PCT/US2014/018147 on Feb. 25, 2014, now abandoned.

(60) Provisional application No. 61/490,675, filed on May 27, 2011, provisional application No. 61/473,359, filed on Apr. 8, 2011, provisional application No. 61/484,421, filed on May 10, 2011, provisional application No. 61/376,225, filed on Aug. 23, 2010, provisional application No. 61/768,618, filed on Feb. 25, 2013, provisional application No. 61/865,704, filed on Aug. 14, 2013.

(51) Int. Cl.

| | |
|---|---|
| *H01J 37/317* | (2006.01) |
| *H01J 37/147* | (2006.01) |
| *H05H 3/02* | (2006.01) |
| *G03F 1/82* | (2012.01) |
| *H01L 21/02* | (2006.01) |
| *H01L 21/265* | (2006.01) |
| *H01L 21/311* | (2006.01) |
| *B24B 37/04* | (2012.01) |
| *H01L 29/36* | (2006.01) |

(52) U.S. Cl.
CPC ............... *H01J 2237/0041* (2013.01); *H01J 2237/0812* (2013.01); *H01J 2237/15* (2013.01); *H01L 29/36* (2013.01); *Y10T 428/24355* (2015.01); *Y10T 428/24479* (2015.01); *Y10T 428/30* (2015.01)

(56) References Cited

U.S. PATENT DOCUMENTS

| | | | | |
|---|---|---|---|---|
| 4,775,789 | A * | 10/1988 | Albridge, Jr. ............ | H05H 3/02 250/251 |
| 4,812,663 | A * | 3/1989 | Douglas-Hamilton ...................... | G01T 1/12 250/443.1 |
| 4,935,623 | A * | 6/1990 | Knauer ..................... | H05H 3/02 118/715 |
| 5,998,097 | A * | 12/1999 | Hatakeyama ........ | H01J 37/3053 250/442.11 |
| 6,486,478 | B1 | 11/2002 | Libby | |
| 6,491,800 | B2 | 12/2002 | Kirkpatrick | |
| 6,635,883 | B2 | 10/2003 | Torti | |
| 6,676,989 | B2 | 1/2004 | Kirkpatrick | |
| 6,737,643 | B2 | 5/2004 | Torti | |
| 7,060,989 | B2 | 6/2006 | Swenson | |
| 7,105,199 | B2 | 9/2006 | Blinn | |
| 7,115,511 | B2 | 10/2006 | Hautala | |
| 7,173,252 | B2 | 2/2007 | Mack | |
| 7,247,845 | B1 | 7/2007 | Gebhardt | |
| 7,405,394 | B2 | 7/2008 | Ono | |
| 7,410,890 | B2 | 8/2008 | Kirkpatrick | |
| 7,794,798 | B2 | 9/2010 | Hautala | |
| 7,825,389 | B2 | 11/2010 | Hautala | |
| 7,855,374 | B2 | 12/2010 | Saito | |
| 7,884,032 | B2 | 2/2011 | Ye | |
| 8,377,460 | B2 | 2/2013 | Khoury | |
| 8,530,859 | B2 | 9/2013 | Kirkpatrick | |
| 8,546,748 | B2 * | 10/2013 | Hughes ................... | C03B 32/00 250/251 |
| 9,144,627 | B2 | 9/2015 | Khoury | |
| 2001/0054686 | A1 * | 12/2001 | Torti ..................... | H01J 27/026 250/288 |
| 2003/0021908 | A1 | 1/2003 | Nickel | |
| 2003/0026990 | A1 | 2/2003 | Yamada | |
| 2005/0205802 | A1 * | 9/2005 | Swenson ............... | H01J 27/026 250/423 R |
| 2005/0277246 | A1 * | 12/2005 | Kirkpatrick ............ | H01J 37/08 438/232 |
| 2006/0097185 | A1 * | 5/2006 | Mack .................... | H01J 27/026 250/423 R |
| 2007/0099438 | A1 * | 5/2007 | Ye ......................... | C23C 14/345 438/778 |
| 2008/0099431 | A1 * | 5/2008 | Kumar ............. | H01J 37/32422 216/44 |
| 2008/0101978 | A1 * | 5/2008 | Ryabova ............... | C04B 35/505 419/54 |
| 2008/0169416 | A1 | 7/2008 | Thompson | |
| 2008/0179537 | A1 * | 7/2008 | Saito ....................... | H01J 37/08 250/427 |
| 2008/0245974 | A1 * | 10/2008 | Kirkpatrick ............ | H01J 37/08 250/492.21 |
| 2009/0074834 | A1 | 3/2009 | Kirkpatrick | |
| 2009/0140165 | A1 * | 6/2009 | Hautala ................ | H01J 27/026 250/427 |
| 2010/0036482 | A1 | 2/2010 | Svrluga | |
| 2010/0099243 | A1 * | 4/2010 | Hwang ............ | H01L 21/26513 438/514 |
| 2010/0226958 | A1 * | 9/2010 | Khoury ............... | A61L 27/3604 424/423 |
| 2010/0227523 | A1 | 9/2010 | Khoury | |
| 2010/0261040 | A1 * | 10/2010 | Foad ...................... | B82Y 10/00 428/800 |
| 2011/0240602 | A1 * | 10/2011 | Becker ................... | H01J 37/08 216/94 |
| 2011/0300599 | A1 * | 12/2011 | Khoury ................... | A61L 27/18 435/180 |
| 2011/0312180 | A1 | 12/2011 | Wang | |
| 2012/0045615 | A1 * | 2/2012 | Kirkpatrick ............ | H01J 37/05 428/141 |
| 2012/0161037 | A1 * | 6/2012 | Farley ............... | H01J 37/32412 250/492.3 |
| 2013/0022494 | A1 * | 1/2013 | Kirkpatrick ............ | A61L 2/087 422/22 |
| 2014/0074159 | A1 * | 3/2014 | Khoury ................... | A61L 17/10 606/228 |
| 2014/0363678 | A1 | 12/2014 | Kirkpatrick | |

FOREIGN PATENT DOCUMENTS

| | | | |
|---|---|---|---|
| KR | 2005117880 | * | 12/2005 |
| WO | 2009084296 | | 7/2009 |
| WO | 2012103229 | | 8/2012 |
| WO | 2013126841 | | 8/2013 |

OTHER PUBLICATIONS

Gardener et al., "A large area thermal detector for fast neutral particles" Journal of Physics E: Scientific Instruments 5(1):712-714 (1972).

Extended European Search Report in corresponding European application No. EP11820497.3, dated Jun. 23, 2016.

Wegner et al., "Gas-phase synthesis of nanostructured particulate films" KONA Powder and Particle 24:54-69 (2006).

Toyoda et al. "Cluster size dependence on energy and velocity distributions of gas cluster ions after collisions with residual gas" Nuclear Instruments and Methods in Physics Research B 257:662-665 (2007).

Swenson "Measurement of averages of charge, energy and mass of large, multiply charged cluster ions colliding with atoms" Nuclear Instruments and Methods in Physics Research B 222:61-67 (2004).

Houzumi et al. "Scanning Tunneling Microscopy Observation of Graphite Surfaces Irradiated with Size-Selected Ar Cluster Ion Beams" Japanese Journal of Applied Physics 44(8):6252-6254 (2005).

Office Action in corresponding Japanese Application No. 2015-559051, dated Dec. 21, 2017.

Moritani et al.; "New Design and Development of Size-Selected Gas Cluster SIMS"; Electrical Engineering in Japan, vol. 176, No. 3; 2011; pp. 52-58.

(56) References Cited

OTHER PUBLICATIONS

Allen et al.; "Gas-Cluster Ion-Beam Smoothing of Chemo-Mechanical-Polish Processed GaSb(100) Substrates"; Journal of Electronic Materials, Warrendale, PA, US, vol. 32, No. 8, Aug. 1, 2003; pp. 842-848.
Office Action dated May 24, 2018 in corresponding European Application No. 14753831.8, filed Feb. 25, 2014, 7 pages.
Chinese National phase application No. 2-1480023532.5 filed Oct. 26, 2015 Parent: PCTUS14/18147 filed Feb. 25, 2014, Office Action from State Intellectual Property Office of the People's Republic of China, First Office Action dated Mar. 9, 2017.

* cited by examiner

TREATMENT METHOD FOR DEFECT REDUCTION IN A SUBSTRATE AND SUBSTRATES TREATED THEREBY

CROSS-REFERENCE TO RELATED APPLICATIONS

This application is a continuation of copending U.S. patent application Ser. No. 14/768,899 filed Aug. 19, 2015, which in turn is a U.S. national stage application under 35 U.S.C. 371 of co-pending International Application No. PCT/US14/18147, filed on Feb. 25, 2014, and entitled DEFECT REDUCTION IN A SUBSTRATE TREATMENT METHOD, which in turn claims priority to and benefit of U.S. Provisional Patent Application Nos. 61/768,618, filed on Feb. 25, 2013, and 61/865,704, filed on Aug. 14, 2013, both of which are incorporated by reference herein in their entirety for all purposes.

This application is a continuation of copending U.S. patent application Ser. No. 14/496,412, filed Sep. 25, 2014, which in turn is a divisional of co-pending U.S. application Ser. No. 13/215,514, filed on Aug. 23, 2011 and entitled METHOD AND APPARATUS FOR NEUTRAL BEAM PROCESSING BASED ON GAS CLUSTER ION BEAM TECHNOLOGY, which in turn claims priority to and benefit of U.S. Provisional Patent Application No. 61/376,225, filed Aug. 23, 2010, U.S. Provisional Patent Application No. 61/490,675, filed May 27, 2011, U.S. Provisional Patent Application No. 61/473,359, filed Apr. 8, 2011, and U.S. Provisional Patent Application No. 61/484,421, filed May 10, 2011, all of which are incorporated herein by reference in their entirety for all purposes.

FIELD OF THE INVENTION

This invention relates generally to methods for treating a surface of a substrate to reduce defect development. More specifically, it relates to treatment of a surface of a substrate, such as a photomask substrate, using an accelerated Neutral Beam derived from an accelerated gas-cluster ion-beam (GCIB). The Neutral Beam is preferably an accelerated neutral monomer beam derived from an accelerated GCIB and removes defects prior to their further development.

BACKGROUND OF THE INVENTION

Chemical slurry mechanical polishing (CMP) techniques are commonly used to provide planar and smooth surfaces on optical materials (such as for example, substrates for lithography photomasks) and other objects/materials. Fused silica and doped fused silica (such as for example titania doped fused silica) materials are commonly employed as substrates for lithography photomasks. For critical applications, photomasks used for lithography must have a high degree of surface smoothness (typically average roughness (Ra)<1.0 angstrom), with an accompanying high degree of surface planarity. CMP in combination with other secondary polishing techniques (such as laser polishing, dressed photon nano-polishing, magneto-rheological fluid polishing, or GCIB polishing, as examples) are capable of forming a smooth, planar surface on materials such as semiconductor materials, silica materials, etc. It is known that due to mechanical stresses occurring during the CMP process, shallow sub-surface defects can be created in the substrate material. Furthermore, small particles may become embedded in the substrate surface during CMP processing, though they may be flattened and planar with respect to the substrate surface. While the CMP and any subsequent secondary polishing leaves the surface smooth and planar, this sub-surface damage and/or embedded particles may have detrimental effects that limit the usability of the finished substrate. After the surface smoothing/planarizing steps (CMP or CMP plus secondary polishing) have been completed, the surface is cleaned with an intense agitation wet cleaning process (for example, ultrasonic solvent cavitation) to remove residual polishing slurry or other contaminating particles on the surface that could otherwise interfere with successful photomask formation, before proceeding with subsequent processing steps including, for example, depositions on the substrate. It is believed that during such aggressive cleaning processes, defects in the sub-surface damage region can propagate to the surface in the form of 'pop outs' that are released from the surface resulting in pits, depressions, or other smoothness defects that compromise the usability of the substrate as a photomask. Also, during aggressive cleaning, surface-embedded particles (polishing slurry materials or other contaminating particles) may be released from the surface leaving small pits in their previous locations. Often these defects do not become visible until later in the process after considerable processing expense has been incurred. Numerous approaches have been employed to find polishing and cleaning methods that reduce sub-surface damage while maintaining the necessary smoothness required, but without complete success in eliminating resultant surface defects that appear at later steps in the photomask fabrication process.

It is therefore an object of this invention to provide methods for treating a surface of a polished photomask substrate such as a polished photomask substrate (or other objects) to reduce defects by removing sub-surface damage prior to aggressive cleaning.

It is another object of this invention to provide polished and cleaned substrates such as for example photomask substrates (or other objects) to result in improved smoothness and reduced surface detects.

SUMMARY OF THE INVENTION

The present invention is directed to the use of an accelerated Neutral Beam derived from an accelerated GCIB for treating a surface of a substrate such as a photomask substrate to reduce defects therein.

Conventional chemical slurry mechanical polishing (CMP) techniques are used to provide smooth planar surfaces on optical materials (for example, without limitation, a substrate for a lithography photomask). A fused silica or doped fused silica (for example, without limitation titania doped fused silica) intended for photomask substrate material is planarized and polished by CMP and optionally with secondary conventional polishing techniques. Secondary polishing techniques may include, for example, laser polishing, dressed photon nano-polishing, magneto-rheological fluid polishing, or GCIB polishing. The resulting smooth planar substrates often contains shallow sub-surface damage and/or small surface-embedded particles that can result in propagation of sub-surface damage to the surface and/or the release of embedded particles from the surface during aggressive wet cleaning. Following the completion of CMP and any secondary planarization, smoothing, and polishing, in an embodiment of the invention, the surface is treated using a Neutral Beam to etch away the shallow surface layer having sub-surface damage and/or embedded particles. The etched surface is then cleaned using conventional aggressive wet cleaning techniques such as cavitation cleaning to remove any remaining loose contaminants prior to subsequent conventional steps in completing a photomask on the substrate (for example deposition, patterning, etc.)

One embodiment of the present invention provides a method of treating a surface of a substrate that contains one or more embedded particles or contains sub-surface damage, comprising the steps of: providing a reduced pressure chamber; forming a gas-cluster ion-beam comprising gas-cluster ions within the reduced pressure chamber; accelerating the gas-cluster ions to form an accelerated gas-cluster ion-beam along a beam path within the reduced pressure chamber; promoting fragmentation and/or dissociation of at least a portion of the accelerated gas-cluster ions along the beam path; removing charged particles from the beam path to form an accelerated neutral beam along the beam path in the reduced pressure chamber; holding the surface in the beam path; and treating at least a portion of the surface of the substrate by irradiating it with the accelerated neutral beam The one or more embedded particles or sub-surface damage may be a result of a previous processing operation. The one or more embedded particles or sub-surface damage may be the result from a previous smoothing or polishing or planarizing operation. The smoothing or polishing or planarizing operation may be a CMP process. The one or more embedded particles or sub-surface damage may result from a previous diamond turning or abrasive grinding operation. The damage may be latent damage.

The treating step may irradiate the portion of the surface to a dose sufficient to etch away a predetermined thickness sufficient to remove one or more embedded particles or sub-surface damage. The method may further comprise cleaning the treated portion to remove one or more residual particles.

The one or more residual particles may be contamination resulting from the treating step. The step of promoting may include raising an acceleration voltage in the step of accelerating or improving ionization efficiency in the forming of the gas cluster ion beam. The step of promoting may include increasing the range of velocities of ions in the accelerated gas cluster ion beam. The stop of promoting may include introducing one or more gaseous elements used in forming the gas cluster ion beam into the reduced pressure chamber to increase pressure along the beam path. The step of promoting may include increasing the size of a skimmer aperture used in the step of forming the gas cluster ion beam. The step of promoting may include irradiating the accelerated gas cluster ion beam or the neutral beam with radiant energy. The neutral beam treating at least a portion of a surface of the workpiece may consist substantially of monomers having energies between 1 eV and several thousand eV. The method may further comprise the step of scanning the workpiece with a workpiece holder to treat extended portions of the surface. The holding step may introduce the substrate that comprises any of; an optical material; a ceramic material; a glass material; a metal material; or silica. The substrate may be a lithography photomask substrate.

Another embodiment provides an article made by the above recited method.

Yet another embodiment provides a lithography photomask comprising a surface treated by the above recited method.

DETAILED DESCRIPTION OF THE PREFERRED METHODS AND EXEMPLARY EMBODIMENTS

Figure 1:
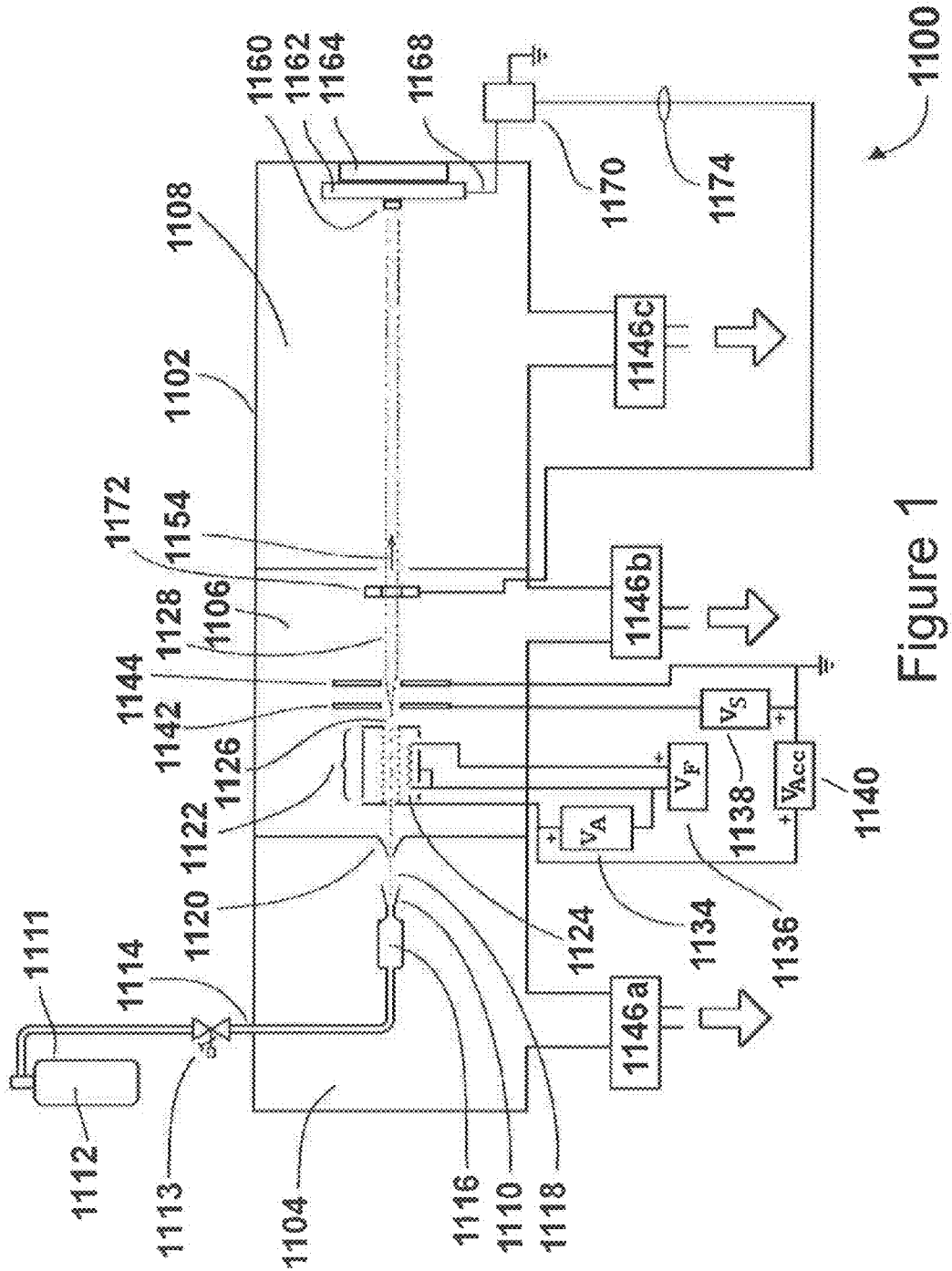
FIG. 1 is a schematic illustrating elements of a GCIB processing apparatus 1100 for processing a workpiece using a GCIB.

Methods and apparatus for forming Neutral Beams by first forming an accelerated charged GCIB and then neutralizing or arranging for neutralization of at least a fraction of the beam and separating the charged and uncharged fractions are disclosed herein. The Neutral Beams may consist of neutral gas clusters, neutral monomers, or a combination of both, but are preferably fully dissociated to neutral monomers.

As compared to GCIB processes, the use of an accelerated Neutral Beam provides a physical surface modification method that results in minimized introduction of charging effects at the surface (especially important when the material is not an electrically conducting material) or when surface charging can harm the material, and thus avoids creating sub-surface damage due to charging effects in insulating materials like silica and other similar materials. In some cases it also reduces average surface roughness below conventional secondary polishing levels, while retaining a high degree of planarity.

Beams of energetic conventional ions, accelerated electrically charged atoms or molecules, are widely utilized to form semiconductor device junctions, to modify surfaces by sputtering and etching, and to modify the properties of thin films. Unlike conventional ions, gas-cluster ions are formed from clusters of large numbers (having a typical distribution of several hundred to several thousand with a mean value of a few thousand) of weakly bound atoms or molecules of materials that are gaseous under conditions of standard temperature and pressure (commonly oxygen, nitrogen, or an inert gas such as argon, for example, but any condensable gas can be used to generate gas-cluster ions) with each cluster sharing one or more electrical charges, and which are accelerated together through large electric potential differences (on the order of from about 3 kV to about 70 kV or more) to have high total energies. After gas-cluster ions have been formed and accelerated, their charge states may be altered or become altered (even neutralized) by collisions with other cluster ions, other neutral clusters, or residual background gas particles, and thus they may fragment or may be induced to fragment into smaller cluster ions or into monomer ions and/or into neutralized smaller clusters and neutralized monomers, but the resulting cluster ions, neutral clusters, and monomer ions and neutral monomers tend to retain the relatively high velocities and energies that result from having been accelerated through large electric potential differences, with the accelerated gas-cluster ion energy being distributed over the fragments.

As used herein, the terms "GCIB", "gas-cluster ton-beam" and "gas-cluster ion" are intended to encompass not only ionized beams and ions, but also accelerated beams and ions that have had a portion of their charge states modified (including neutralized) following their acceleration. The terms "GCIB" and "gas-cluster ion-beam" are intended to encompass all beams that comprise accelerated gas-cluster ions even though they may also comprise non-clustered particles. As used herein, the term "Neutral Beam" is intended to mean a beam of neutral gas clusters and/or neutral monomers derived from an accelerated gas-cluster ion-beam and wherein the acceleration results from acceleration of a gas-cluster ion-beam. As used herein, the term "monomer" refers equally to either a single atom or a single molecule. The terms "atom," "molecule," and "monomer" may be used interchangeably and all refer to the appropriate monomer that is characteristic of the gas under discussion (either a component of a cluster, a component of a cluster ion, or an atom or molecule). For example, a monatomic gas like argon may be referred to in terms of atoms, molecules, or monomers and each of those terms means a single atom. Likewise, in the case of a diatomic gas like nitrogen, it may be referred to in terms of atoms, molecules, or monomers, each term meaning a diatomic molecule. Furthermore a molecular gas like $CH_4$, may be referred to in terms of atoms, molecules, or monomers, each term meaning a five atom molecule, and so forth. These conventions are used to simplify generic discussions of gases and gas clusters or gas-cluster ions independent of whether they are monatomic, diatomic, or molecular in their gaseous form.

Because the energies of individual atoms within a large gas-cluster ion are very small, typically a few eV to some tens of eV, the atoms penetrate through, at most, only a few atomic layers of a target surface during impact. This shallow penetration (typically a few nanometers about ten nanometers, depending on the beam acceleration) of the impacting atoms means all of the energy carried by the entire cluster ion is consequently dissipated in an extremely small volume in a very shallow surface layer during a time period of less than a microsecond. This differs from conventional ion beams where the penetration into the material is sometimes several hundred nanometers, producing changes and material modification deep below the surface of the material. Because of the high total energy of the gas-cluster ion and extremely small interaction volume, the deposited energy density at the impact site is far greater than in the case of bombardment by conventional ions. Accordingly, GCIB modification of a surface tends to produce a shallower region of atomic mixing and has thus been favored as an etching beam for depth profiling in analytical instruments. Neutral Beam processing of a surface can produce even shallower modification of a surface with less surface electrical charging.

When accelerated gas-cluster ions are fully dissociated and neutralized, the resulting neutral monomers will have energies approximately equal to the total energy of the original accelerated gas-cluster ion, divided by the number, $N_1$, of monomers that comprised the original gas-cluster ion at the time it was accelerated. Such dissociated neutral monomers will have energies on the order of from about 1 eV to tens or even as much as a few thousands of eV, depending on the original accelerated energy of the gas-cluster ion and the size of the gas-cluster ion at the time of acceleration.

Gas-cluster ion-beams are generated and transported for purposes of irradiating a workpiece according to known techniques. Various types of holders are known in the art for holding the object in the path of the GCIB for irradiation and for manipulating the object to permit irradiation of a multiplicity of portions of the object. Neutral Beams may be generated and transported for purposes of irradiating a workpiece according to techniques taught herein.

The present invention may employ a high beam-purity method and system for deriving from an accelerated gas-cluster ion-beam an accelerated neutral gas cluster and/or preferably monomer beam that can be employed for a variety of types of surface and shallow subsurface materials processing and which is capable, for many applications, of superior performance compared to conventional GCIB processing. A Neutral Beam apparatus can provide well-focused, accelerated, intense neutral monomer beams with particles having energies in the range of from about 1 eV to as much as a few thousand eV. This is an energy range in which it has heretofore been impractical with simple, relatively inexpensive apparatus to form intense neutral beams.

These accelerated Neutral Beams are generated by first forming a conventional accelerated GCIB, then partly or essentially fully dissociating it by methods and operating conditions that do not introduce impurities into the beam., then separating the remaining charged portions of the beam from the neutral portion, and subsequently using the resulting accelerated Neutral Beam for workpiece processing. Depending on the degree of dissociation of the gas-cluster ions, the Neutral Beam produced may be a mixture of neutral gas monomers and gas clusters or may essentially consist entirely or almost entirely of neutral gas monomers. It is preferred that the accelerated Neutral Beam is a fully dissociated neutral monomer beam.

An advantage of the Neutral Beams that may be produced by the methods and apparatus of this invention, is that they may be used to process electrically insulating materials without producing damage to the material due to charging of the surfaces of such materials by beam transported charges as commonly occurs for all ionized beams including GCIB. For example, in some applications, ions often contribute to damaging or destructive charging of thin dielectric films such as oxides, nitrides, etc. The use of Neutral Beams can enable successful beam processing of polymer, dielectric, and/or other electrically insulating or high electrical resistivity materials, coatings, and films in applications where ion beams may produce undesired side effects due to surface or other charging effects. Examples include (without limitation) processing of corrosion inhibiting coatings, and irradiation cross-linking and/or polymerization of organic films. Further examples include Neutral Beam processing of glass, polymer, and ceramic materials as well as thin film dielectric coatings such as oxides, nitrides, glasses, etc.

Another advantage of accelerated neutral monomer beams derived from an accelerated GCIB, when used in surface modification applications, is that they form a much shallower disrupted layer in the processed surface when compared even with GCIBs used in the same way, Since the parent GCIB, from which accelerated Neutral Beams may be formed by the methods and apparatus of the invention, comprises ions it is readily accelerated to desired energy and is readily focused using conventional ion beam techniques. Upon subsequent dissociation and separation of the charged ions from the neutral particles, the neutral beam particles tend to retain their focused trajectories and may be transported for extensive distances with good effect.

When neutral gas clusters in a jet are ionized by electron bombardment, they become heated and/or excited. This may result in subsequent evaporation of monomers from the ionized gas cluster, after acceleration, as it travels down the beamline. Additionally, collisions of gas-cluster ions with background gas molecules in the ionizer, accelerator and beamline regions also heat and excite the gas-cluster ions and may result in additional subsequent evolution of monomers from the gas-cluster ions following acceleration. When these mechanisms for evolution of monomers are induced by electron bombardment and/or collision with background gas molecules (and/or other gas clusters) of the same gas from which the GCIB was formed, no contamination is contributed to the beam by the dissociation processes that results in evolving the monomers.

There are other mechanisms that can be employed for dissociating (or inducing evolution of monomers from) gas-cluster ions in a GCIB without introducing contamination into the beam. Some of these mechanisms may also be employed to dissociate neutral gas-clusters in a neutral gas-cluster beam. One mechanism is laser irradiation of the gas-cluster ion-beam using infra-red or other laser energy. Laser-induced heating of the gas-cluster ions in the laser irradiated GCIB results in excitement and/or heating of the gas-cluster ions and causes subsequent evolution of monomers from the beam. Another mechanism is passing the beam through a thermally heated tube so that radiant thermal energy photons impact the gas-cluster ions in the beam. The induced heating of the gas-cluster ions by the radiant thermal energy in the tube results in excitement and/or heating of the gas-cluster ions and causes subsequent evolution of monomers from the beam. In another mechanism, crossing the gas-cluster ion-beam by a gas jet of the same gas or mixture as the source gas used in formation of the GCIB (or other non-contaminating gas) results in collisions of monomers of the gas in the gas jet with the gas clusters in the ion beam producing excitement and/or heating of the gas-cluster ions in the beam and subsequent evolution of monomers from the excited gas-cluster ions. By depending entirely on electron bombardment during initial ionization and/or collisions (with other cluster ions, or with background gas molecules of the same gas(es) as those used to form the GCIB) within the beam and/or laser or thermal radiation and/or crossed jet collisions of non-contaminating gas to produce the GCIB dissociation and/or fragmentation, contamination of the beam by collision with other materials is avoided.

Through the use of such non-contaminating methods of dissociation described above, the GCIB is dissociated or at least partially dissociated without introducing atoms to the dissociation products or residual clusters that are not part of the original source gas atoms. By using a source gas for initial cluster formation that does not contain atoms which would be contaminants for the workpiece to be processed using the residual clusters or dissociation products, contamination of the workpiece is avoided. When argon or other noble gases are employed, the source gas materials are volatile and not chemically reactive, and upon subsequent irradiation of the workpiece using Neutral Beams these volatile non-reactive atoms are fully released from the workpiece. Thus for workpieces that are optical materials including glasses, quartz, sapphire, diamond, and other hard, transparent materials, argon and other noble gases can serve as source gas materials without contributing contamination due to Neutral Beam irradiation. In other cases, other source gases may be employed, provided the source gas atomic constituents do not include atoms that would result in contamination of the workpiece. For example, glass and silica workpieces, and various other optical materials are oxygen-containing, and oxygen atoms may not serve as contaminants. In such cases oxygen-containing source gases may be employed without contamination, and so forth for other gases and workpiece materials.

As a neutral gas-cluster jet from a nozzle travels through an ionizing region where electrons are directed to ionize the clusters, a cluster may remain un-ionized or may acquire a charge state, q, of one or more charges (by ejection of electrons from the cluster by an incident electron). The ionizer operating conditions influence the likelihood that a gas cluster will take on a particular charge state, with more intense ionizer conditions resulting in greater probability that a higher charge state will be achieved. More intense ionizer conditions resulting in higher ionization efficiency may result from higher electron flux and/or higher (within limits) electron energy. Once the gas cluster has been ionized, it is typically extracted from the ionizer, focused into a beam, and accelerated by falling through an electric field. The amount of acceleration of the gas-cluster ion is readily controlled by controlling the magnitude of the accelerating electric field. Typical commercial GCIB processing tools generally provide for the gas-cluster ions to be accelerated by an electric field having an adjustable accelerating potential, $V_{Acc}$, typically of, for example, from about 1 kV to 70 kV (but not limited to that range—$V_{Acc}$ up to 200 kV or even more may be feasible). Thus a singly charged gas-cluster ion achieves an energy in the range of from 1 to 70 keV (or more if larger $V_{Acc}$ is used) and a multiply charged (for example, without limitation, charge state, q=3 electronic charges) gas-cluster ion achieves an energy in the range of from 3 to 210 keV (or more for higher $V_{Acc}$). For other gas-cluster ion charge states and acceleration potentials, the accelerated energy per cluster $qV_{Acc}$ eV. From a given ionizer with a given ionization efficiency, gas-cluster ions will have a distribution of charge states from zero (not ionized) to a higher number such as, for example, 6 (or with high ionizer efficiency, even more), and the most probable and mean values of the charge state distribution also increase with increased ionizer efficiency (higher electron flux and/or energy). Higher ionizer efficiency also results in increased numbers of gas-cluster ions being formed in the ionizer. In many cases, GCIB processing throughput increases when operating the ionizer at high efficiency results in increased GCIB current. A downside of such operation is that multiple charge states that may occur on intermediate size gas-cluster ions can increase crater and/or rough interface formation by those ions, and often such effects may operate counterproductively to the intent of the processing. Thus for many GCIB surface processing recipes, selection of the ionizer operating parameters tends to involve more considerations than just maximizing beam current. In some processes, use of a "pressure cell" (see U.S. Pat. No. 7,060,989, to Swenson et al.) may be employed to permit operating an ionizer at high ionization efficiency while still obtaining acceptable beam processing performance by moderating the beam energy by gas collisions in an elevated pressure "pressure cell."

With the present invention there is no downside to operating the ionizer at high efficiency—in fact such operation may be preferred. When the ionizer is operated at high efficiency, there may be a wide range of charge states in the gas-cluster ions produced by the ionizer. This results in a wide range of velocities in the gas-cluster ions in the extraction region between the ionizer and the accelerating electrode, and also in the downstream beam. This may result in an enhanced frequency of collisions between and among gas-cluster ions in the beam that generally results in a higher degree of fragmentation of the largest gas-cluster ions. Such fragmentation may result in a redistribution of the cluster sizes in the beam, skewing it toward the smaller cluster sizes. These cluster fragments retain energy in proportion to their new size (N) and so become less energetic while essentially retaining the accelerated velocity of the initial unfragmented gas-cluster ion. The change of energy with retention of velocity following collisions has been experimentally verified (as for example reported in Toyoda, N. et al., "Cluster size dependence on energy and velocity distributions of gas-cluster ions after collisions with residual gas," *Nucl. Instr. & Meth. in Phys. Research* B 257 (2007), pp 662-665). Fragmentation may also result in redistribution of charges in the cluster fragments. Some uncharged fragments likely result and multi-charged gas-cluster ions may fragment into several charged gas-cluster ions and perhaps some uncharged fragments. It is understood by the inventors that design of the focusing fields in the ionizer and the extraction region may enhance the focusing of the smaller gas-cluster ions and monomer ions to increase the likelihood of collision with larger gas-cluster ions in the beam extraction region and in the downstream beam, thus contributing to the dissociation and/or fragmenting of the gas-cluster ions.

In generating a Neutral Beam, background gas pressure in the ionizer, acceleration region, and beamline may optionally be arranged to have a higher pressure than is normally utilized for good GCIB transmission. This can result in additional evolution of monomers from gas-cluster ions (beyond that resulting from the heating and/or excitement resulting from the initial gas cluster ionization event). Pressure may be arranged so that gas-cluster ions have a short enough mean-free-path and a long enough flight path between ionizer and workpiece that they must undergo multiple collisions with background gas molecules.

For a homogeneous gas-cluster ion containing N monomers and having a charge state of q and which has been accelerated through an electric field potential drop of $V_{Acc}$ volts, the cluster will have energy of approximately $qV_{Acc}/N_1$ eV per monomer, where $N_1$ is the number of monomers in the cluster ion at the time of acceleration. Except for the smallest gas-cluster ions, a collision of such an ion with a background as monomer of the same gas as the cluster source gas will result in additional deposition of approximately $qV_{Acc}/N_1$ eV into the gas-cluster ion. This energy is relatively small compared to the overall gas-cluster ion energy ($qV_{Acc}$) and generally results in excitation or heating of the cluster and in subsequent evolution of monomers from the cluster. It is believed that such collisions of larger clusters with background gas seldom fragment the cluster but rather heats and/or excites it to result in evolution of monomers by evaporation or similar mechanisms. Regardless of the source of the excitation that results in the evolution of a monomer or monomers from a gas-cluster ion, the evolved monomer(s) have approximately the same energy per particle, $qV_{Acc}/N_1$ eV, and retain approximately the same velocity and trajectory as the gas-cluster ion from which they have evolved. When such monomer evolutions occur from a gas-cluster ion, whether they result from excitation or heating due to the original ionization event, a collision, or radiant heating, the charge has a high probability of remaining with the larger residual gas-cluster ion.

Thus after a sequence of monomer evolutions, a large gas-cluster ion may be reduced to a cloud of co-traveling monomers with perhaps a smaller residual gas-cluster ion (or possibly several if fragmentation has also occurred). The co-traveling monomers following the original beam trajectory all have approximately the same velocity as that of the original gas-cluster ion and each has energy of approximately $qV_{Acc}/N_1$ eV. For small gas-cluster ions, the energy of collision with a background gas monomer is likely to completely and violently dissociate the small gas cluster and it is uncertain whether in such cases the resulting monomers continue to travel with the beam or are ejected from the beam.

Prior to the GCIB reaching the workpiece, the remaining charged particles (gas-cluster ions, particularly small and intermediate size gas-cluster ions and some charged monomers, but also including any remaining large gas-cluster ions) in the beam are separated from the neutral portion of the beam, leaving only a Neutral Beam for processing the workpiece.

In typical operation, the traction of power in the neutral beam components relative to that in the full (charged plus neutral) beam delivered at the processing target is in the range of from about 5% to 95%, so by the separation methods and apparatus of the present invention it is possible to deliver that portion of the kinetic energy of the full accelerated charged beam to the target as a Neutral Beam.

The dissociation of the gas-cluster ions and thus the production of high neutral monomer beam energy is facilitated by 1) Operating at higher acceleration voltages. This increases $qV_{Acc}/N$ for any given cluster size. 2) Operating at high ionizer efficiency. This increases $qV_{Acc}/N$ for any given cluster size by increasing q and increases cluster-ion on cluster-ion collisions in the extraction region due to the differences in charge states between clusters; 3) Operating at a high ionizer, acceleration region, or beamline pressure or operating with a gas jet crossing the beam, or with a longer beam path, all of which increase the probability of background gas collisions for a gas-cluster ion of any given size; 4) Operating with laser irradiation or thermal radiant heating of the beam, which directly promote evolution of monomers from the gas-cluster ions; and 5) Operating at higher nozzle gas flow, which increases transport of gas, clustered and perhaps unclustered into the GCIB trajectory, which increases collisions resulting in greater evolution of monomers.

Measurement of the Neutral Beam cannot be made by electrical beam current or charge measurement as is convenient for gas-cluster ion-beams. A Neutral Beam power sensor may be used to facilitate dosimetry when irradiating a workpiece with a Neutral Beam. The Neutral Beam sensor may be a thermal sensor that intercepts the beam (or optionally a known sample of the beam). The rate of rise of temperature of the sensor is related to the energy flux resulting from energetic beam irradiation of the sensor. Such thermal measurements must be made over a limited range of temperatures of the sensor to avoid errors due to thermal re-radiation of the energy incident on the sensor. For a GCIB process, the beam power (watts) is equal to the beam current (amps) times $V_{Acc}$ the beam acceleration voltage. When a GCIB irradiates a workpiece for a period of time (seconds), the energy (joules) received by the workpiece is the product of the beam power and the irradiation time. The processing effect of such a beam when it processes an extended area is distributed over the area (for example, $cm^2$). For ion beams, it has been conveniently conventional to specify a processing dose in terms of irradiated ions/$cm^2$, where the ions are either known or assumed to have at the time of acceleration an average charge state, q, and to have been accelerated through a potential difference of, $V_{Acc}$ volts, so that each ion carries an energy of q $V_{Acc}$ eV (an eV is approximately $1.6 \times 10^{-19}$ joule). Thus an ion beam dose for an average charge state, q, accelerated by $V_{Acc}$ and specified in ions/cm$^2$ corresponds to a readily calculated energy close expressible in joules/cm$^2$. For an accelerated Neutral Beam derived from an accelerated GCIB as utilized in the present invention, the value of q at the time of acceleration and the value of $V_{Acc}$ is the same for both of the (later-formed and separated) charged and uncharged fractions of the beam. The power in the two (neutral and charged) fractions of the GCIB divides proportional to the mass in each beam fraction. Thus for the accelerated Neutral Beam as employed in the invention, when equal areas are irradiated for equal times, the energy dose (joules/cm$^2$) deposited by the Neutral Beam is necessarily less than the energy dose deposited by the full GCIB. By using a thermal sensor to measure the power in the full GCIB $P_G$ and that in the Neutral Beam $P_N$ (which is commonly found to be about 5% to 95% that of the full GCIB) it is possible to calculate a compensation factor for use in the Neutral Beam processing dosimetry. When $P_N$ is a $P_G$, then the compensation factor is, k=1/a. Thus if a workpiece is processed using a Neutral Beam derived from a GCIB, for a time duration is made to be k times greater than the processing duration for the full GCIB (including charged and neutral beam portions) required to achieve a dose of D ions/cm$^2$, then the energy doses deposited in the workpiece by both the Neutral Beam and the full GCIB are the same (though the results may be different due to qualitative differences in the processing effects due to differences of particle sizes in the two beams.) As used herein, a Neutral Beam process dose compensated in this way is sometimes described as having an energy/cm$^2$ equivalence of a dose of D ions/cm$^2$, Other methods for Neutral Beam dosimetry may also be employed. Examples of such alternative methods are disclosed in commonly held U.S. patent application Ser. No. 13/660,295 filed 25 Oct. 2012, entitled "DIAGNOSTIC METHOD AND APPARATUS FOR CHARACTERIZATION OF A NEUTRAL BEAM AND FOR PROCESS CONTROL THEREWITH."

In the following description, for simplification, item numbers from earlier-described figures may appear in subsequently-described figures without discussion. Likewise, items discussed in relation to earlier figures may appear in subsequent figures without item numbers or additional description. In such cases items with like numbers are like items and have the previously-described features and functions, and illustration of items without item numbers shown in the present figure refer to like items having the same functions as the like items illustrated in earlier-discussed numbered figures.

Reference is now made to FIG. 1, which shows a schematic configuration for a GCIB processing apparatus 1100. A low-pressure vessel 1102 has three fluidly connected chambers: a nozzle chamber 1104, an ionization/acceleration chamber 1106, and a processing chamber 1108. The three chambers are evacuated by vacuum pumps 1146a, 1146b, and 1146c, respectively. A pressurized condensable source gas 1112 (for example argon) stored in a gas storage cylinder 1111 flows through a gas metering valve 1113 and a feed tube 1114 into a stagnation chamber 1116. Pressure (typically a few atmospheres) in the stagnation chamber 1116 results in ejection of gas into the substantially lower pressure vacuum through a nozzle 1110, resulting in formation of a supersonic gas jet 1118. Cooling, resulting from the expansion in the jet, causes a portion of the gas jet 1118 to condense into clusters, each consisting of from several to several thousand weakly bound atoms or molecules. A gas skimmer aperture 1120 is employed to control flow of gas into the downstream chambers by partially separating gas molecules that have not condensed into a cluster jet from the cluster jet. Excessive pressure in the downstream chambers can be detrimental by interfering with the transport of gas-cluster ions and by interfering with management of the high voltages that may be employed for beam formation and transport. Suitable condensable source gases 1112 include, but are not limited to argon and other condensable noble gases, nitrogen, carbon dioxide, oxygen, and many other gases and/or gas mixtures. After formation of the gas clusters in the supersonic gas jet 1118, at least a portion of the gas clusters are ionized in an ionizer 1122 that is typically an electron impact ionizer that produces electrons by thermal emission from one or more incandescent filaments 1124 (or from other suitable electron sources) and accelerates and directs the electrons, enabling them to collide with gas clusters in the gas jet 1118. Electron impacts with gas clusters eject electrons from some portion of the as clusters, causing those clusters to become positively ionized. Some clusters may have more than one electron ejected and may become multiply ionized. Control of the number of electrons and their energies after acceleration typically influences the number of ionizations that may occur and the ratio between multiple and single ionizations of the gas clusters. A suppressor electrode 1142, and grounded electrode 1144 extract the cluster ions from the ionizer exit aperture 1126, accelerate them to a desired energy (typically with acceleration potentials of from several hundred V to several tens of kV), and focuses them to form a GCIB 1128. The region that the GCIB 1128 traverses between the ionizer exit aperture 126 and the suppressor electrode 1142 is referred to as the extraction region. The axis (determined at the nozzle 1110), of the supersonic gas jet 1118 containing gas clusters is substantially the same as the axis 1154 of the GCIB 1128. Filament power supply 1136 provides filament voltage $V_f$ to heat the ionizer filament 1124. Anode power supply 1134 provides anode voltage $V_A$ to accelerate thermoelectrons emitted from filament 1124 to cause the thermoelectrons to irradiate the cluster-containing gas jet 1118 to produce cluster ions. A suppression power supply 1138 supplies suppression voltage $V_S$ (on the order of several hundred to a few thousand volts) to bias suppressor electrode 1142. Accelerator power supply 1140 supplies acceleration voltage $V_{Acc}$ to bias the ionizer 1122 with respect to suppressor electrode 1142 and grounded electrode 1144 so as to result in a total GCIB acceleration potential equal to $V_{Acc}$. Suppressor electrode 1142 serves to extract ions from the ionizer exit aperture 1126 of ionizer 1122 and to prevent undesired electrons from entering the ionizer 1122 from downstream, and to form a focused GCIB 1128.

A workpiece 1160, which may (for example) be a medical device, a semiconductor material, an optical element, or other workpiece to be processed by GCIB processing, is held on a workpiece holder 1162, which disposes the workpiece in the path of the GCIB 1128. The workpiece holder is attached to but electrically insulated from the processing chamber 1108 by an electrical insulator 1164. Thus, GCIB 1128 striking the workpiece 1160 and the workpiece holder 1162 flows through an electrical lead 1168 to a dose processor 1170. A beam gate 1172 controls transmission of the GCIB 1128 along axis 1154 to the workpiece 1160. The beam gate 1172 typically has an open state and a closed state that is controlled by a linkage 1174 that may be (for example) electrical, mechanical, or electromechanical. Dose processor 1170 controls the open/closed state of the beam gate 1172 to manage the GCIB dose received by the workpiece 1160 and the workpiece holder 1162. In operation, the dose processor 1170 opens the beam gate 1172 to initiate GCIB irradiation of the workpiece 1160. Dose processor 1170 typically integrates GCIB electrical current arriving at the workpiece 1160 and workpiece holder 1162 to calculate an accumulated GCIB irradiation dose. At a predetermined dose, the dose processor 1170 closes the beam gate 1172, terminating processing when the predetermined dose has been achieved.

Figure 2:
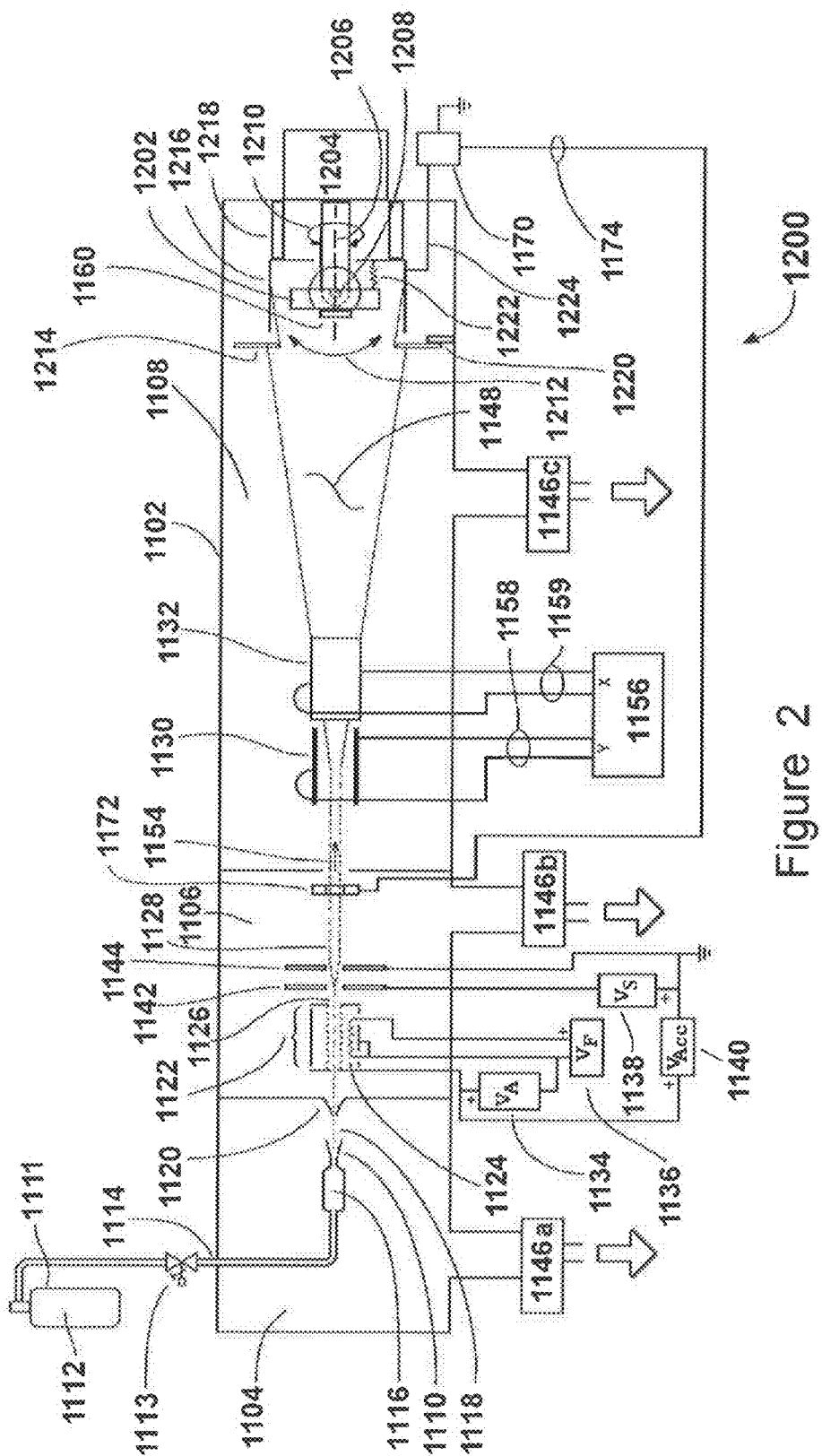
FIG. 2 is a schematic illustrating elements of another GCIB processing apparatus 1200 for workpiece processing using a GCIB, wherein scanning of the ion beam and manipulation of the workpiece is employed.

FIG. 2 shows a schematic illustrating elements of another GCIB processing apparatus 1200 for workpiece processing using a GCIB, wherein scanning of the ion beam and manipulation of the workpiece is employed. A workpiece 1160 to be processed by the GCIB processing apparatus 1200 is held on a workpiece holder 1202, disposed in the path of the GCIB 1128. In order to accomplish uniform processing of the workpiece 1160, the workpiece holder 1202 is designed to manipulate workpiece 1160, as may be required for uniform processing.

Any workpiece surfaces that are non-planar, for example, spherical or cup-like, rounded, irregular, or other un-flat configuration, may be oriented within a range of angles with respect to the beam incidence to obtain optimal GCIB processing of the workpiece surfaces. The workpiece holder 1202 can be fully articulated for orienting all non-planar surfaces to be processed in suitable alignment with the GCIB 1123 to provide processing optimization and uniformity. More specifically, when the workpiece 1160 being processed is non-planar, the workpiece holder 1202 may he rotated in a rotary motion 1210 and articulated in articulation motion 1212 by an articulation/rotation mechanism 1204. The articulation/rotation mechanism 1204 may permit 360 degrees of device rotation about longitudinal axis 1206 (which is coaxial with the axis 1154 of the GCIB 1128) and sufficient articulation about an axis 1208 perpendicular to axis 1206 to maintain the workpiece surface to within a desired range of beam incidence.

Under certain conditions, depending upon the size of the workpiece 1160, a scanning system may be desirable to produce uniform irradiation of a large workpiece. Although often not necessary for GCIB processing, two pairs of orthogonally oriented electrostatic scan plates 1130 and 1132 may be utilized to produce a raster or other scanning pattern over an extended processing area. When such beam scanning is performed, a scan generator 1156 provides X-axis scanning signal voltages to the pair of scan plates 1132 through lead pair 1159 and Y-axis scanning signal voltages to the pair of scan plates 1130 through lead pair 1158. The scanning signal voltages are commonly triangular waves of different frequencies that cause the GCIB 1128 to be converted into a scanned GCIB 1148, which scans the entire surface of the workpiece 1160. A scanned beam-defining aperture 1214 defines a scanned area. The scanned beam-defining aperture 1214 is electrically conductive and is electrically connected to the low-pressure vessel 1102 wall and supported by support member 1220. The workpiece holder 1202 is electrically connected via a flexible electrical lead 1222 to a faraday cup 1216 that surrounds the workpiece 1160 and the workpiece holder 1202 and collects all the current passing through the defining aperture 1214. The workpiece holder 1202 is electrically isolated from the articulation/rotation mechanism 1204 and the faraday cup 1216 is electrically isolated from and mounted to the low-pressure vessel 1102 by insulators 1218. Accordingly, all current from the scanned GCIB 1148, which passes through the scanned beam-defining aperture 1214 is collected in the faraday cup 1216 and flows through electrical lead 1224 to the dose processor 1170. In operation, the dose processor 1170 opens the beam gate 1172 to initiate GCIB irradiation of the workpiece 1160. The dose processor 1170 typically integrates GCIB electrical current arriving at the workpiece 1160 and workpiece holder 1202 and faraday cup 1216 to calculate an accumulated GCIB irradiation dose per unit area. At a predetermined dose, the dose processor 1170 closes the beam gate 1172, terminating processing when the predetermined dose has been achieved. During the accumulation of the predetermined dose, the workpiece 1160 may be manipulated by the articulation/rotation mechanism 1204 to ensure processing of all desired surfaces.

Figure 3:
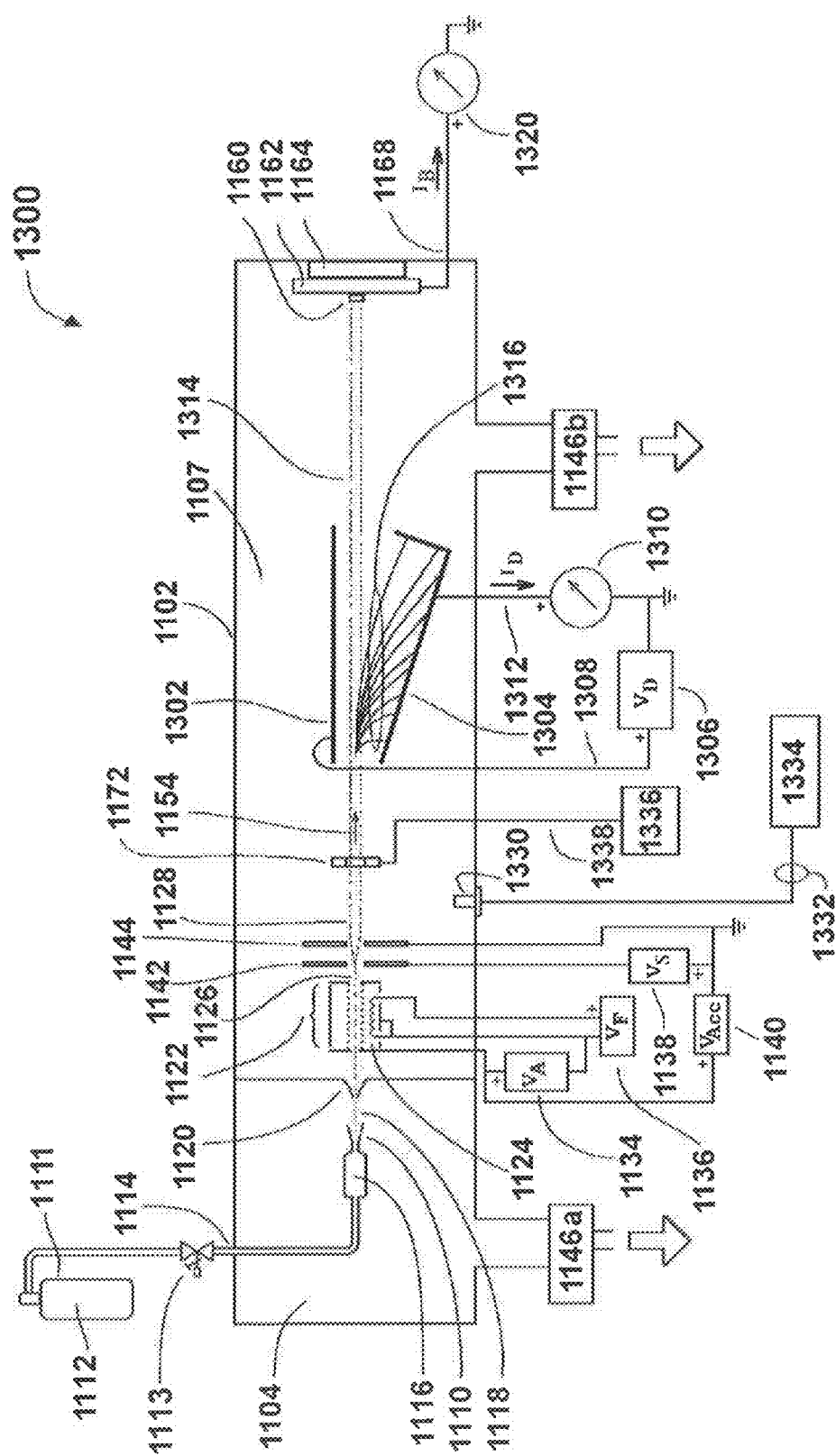
FIG. 3 is a schematic of a Neutral Beam processing apparatus 1300, which uses electrostatic deflection plates to separate the charged and uncharged beams.

FIG. 3 is a schematic of a Neutral Beam processing apparatus 1300 of an exemplary type that may be employed for Neutral Beam processing according to embodiments of the invention. It uses electrostatic deflection plates to separate the charged and uncharged portions of a GCIB. A beamline chamber 1107 encloses the ionizer and accelerator regions and the workpiece processing regions. The beamline chamber 1107 has high conductance and so the pressure is substantially uniform throughout. A vacuum pump 1146b evacuates the beamline chamber 1107. Gas flows into the beamline chamber 1107 in the form of clustered and unclustered gas transported by the gas jet 1118 and in the form of additional unclustered gas that leaks through the gas skimmer aperture 1120. A pressure sensor 1330 transmits pressure data from the beamline chamber 1107 through an electrical cable 1332 to a pressure sensor controller 1334, which measures and displays pressure in the beamline chamber 1107. The pressure in the beamline chamber 1107 depends on the balance of gas flow into the beamline chamber 1107 and the pumping speed of the vacuum pump 1146b. By selection of the diameter of the gas skimmer aperture 1120, the flow of source gas 1112 through the nozzle 1110, and the pumping speed of the vacuum pump 1146b, the pressure in the beamline chamber 1107 equilibrates at a pressure, PB, determined by design and by nozzle flow. The beam flight path from grounded electrode 1144 to workpiece holder 162, is for example, 100 cm. By design and adjustment PB may be approximately $6 \times 10^{-5}$ torr ($8 \times 10^{-3}$ pascal). Thus the product of pressure and beam path length is approximately $6 \times 10^{-3}$ torr-cm (0.8 pascal-cm) and the gas target thickness for the beam is approximately $1.94 \times 10^{14}$ gas molecules per cm$^2$, which is observed to be effective for dissociating the gas-cluster ions in the GCIB 1128. $V_{Acc}$ may be for example 30 kV and the GCIB 1128 is accelerated by that potential. A pair of deflection plates (1302 and 1304) is disposed about the axis 1154 of the GCIB 1128. A deflector power supply 1306 provides a positive deflection voltage $V_D$ to deflection plate 1302 via electrical lead 1308. Deflection plate 1304 is connected to electrical ground by electrical lead 1312 and through current sensor/display 1310. Deflector power supply 1306 is manually controllable. $V_D$ may be adjusted from zero to a voltage sufficient to completely deflect the ionized portion 1316 of the GCIB 1128 onto the deflection plate 1304 (for example a few thousand volts). When the ionized portion 1316 of the GCIB 1128 is deflected onto the deflection plate 1304, the resulting current, $I_D$ flows through electrical lead 1312 and current sensor/display 1310 for indication. When $V_D$ is zero, the GCIB 1128 is undeflected and travels to the workpiece 1160 and the workpiece holder 1162. The GCIB beam current la is collected on the workpiece 1160 and the workpiece holder 1162 and flows through electrical lead 1168 and current sensor/display 1320 to electrical ground. $I_B$ is indicated on the current sensor/display 1320. A beam gate 1172 is controlled through a linkage 1338 by beam gate controller 1336. Beam gate controller 1336 may be manual or may be electrically or mechanically timed by a preset value to open the beam gate 1172 for a predetermined interval. In use, $V_D$ is set to zero and the beam current, $I_B$, striking the workpiece holder is measured. Based on previous experience for a given GCIB process recipe, an initial irradiation time for a given process is determined based on the measured current, $I_B$. $V_D$ is increased until all measured beam current is transferred from $I_B$ to $I_D$ and $I_D$ no longer increases with increasing $V_D$. At this point a Neutral Beam 1314 comprising energetic dissociated components of the initial GCIB 1128 irradiates the workpiece holder 1162. The beam gate 1172 is then closed and the workpiece 1160 placed onto the workpiece holder 1162 by conventional workpiece loading means (not shown). The beam gate 1172 is opened for the predetermined initial radiation time. After the irradiation interval, the workpiece may be examined and the processing time adjusted as necessary to calibrate the duration of Neutral Beam processing based on the measured GCIB beam current $I_B$. Following such a calibration process, additional workpieces may be processed using the calibrated exposure duration.

The Neutral Beam 1314 contains a repeatable fraction of the initial energy of the accelerated GCIB 1128. The remaining ionized portion 1316 of the original GCIB 1128 has been removed from the Neutral Beam 1314 and is collected by the grounded deflection plate 1304. The ionized portion 1316 that is removed from the Neutral Beam 1314 may include monomer ions and gas-cluster ions including intermediate size gas-cluster ions. Because of the monomer evaporation mechanisms due to cluster heating during the ionization process, intra-beam collisions, background gas collisions, and other causes (all of which result in erosion of clusters) the Neutral Beam substantially consists of neutral monomers, while the separated charged particles are predominately cluster ions. The inventors have confirmed this by suitable measurements that include re-ionizing the Neutral Beam and measuring the charge to mass ratio of the resulting ions. As will be shown below, certain superior process results are obtained by processing workpieces using this Neutral Beam.

Figure 4:
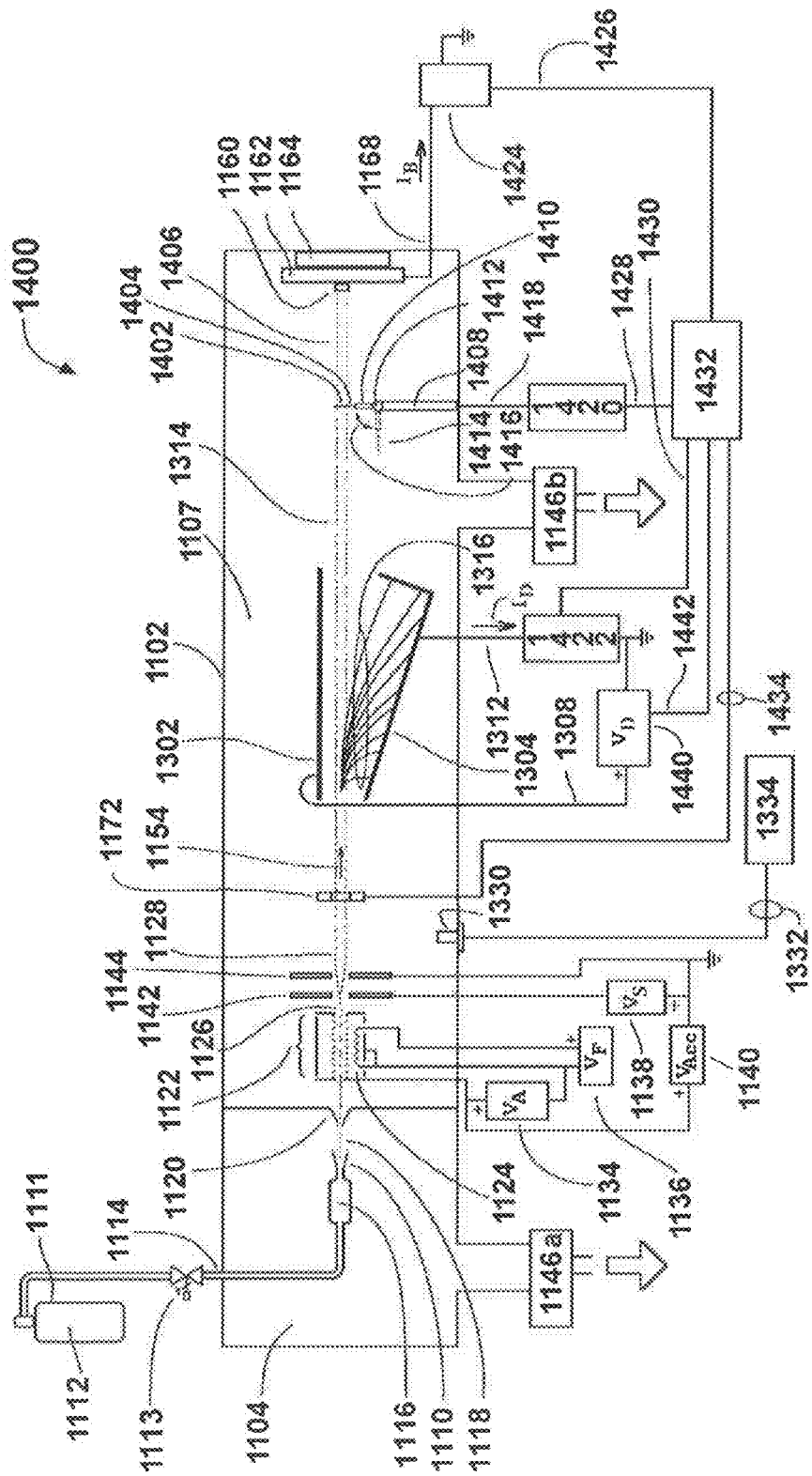
FIG. 4 is a schematic of a Neutral Beam processing apparatus 1400 using a thermal sensor for Neutral Beam measurement.

FIG. 4 is a schematic of a Neutral Beam processing apparatus 1400 as may, for example, be used in generating Neutral Beams as may be employed in embodiments of the invention. It uses a thermal sensor for Neutral Beam measurement. A thermal sensor 1402 attaches via low thermal conductivity attachment 1404 to a rotating support arm 1410 attached to a pivot 1412. Actuator 1408 moves thermal sensor 1402 via a reversible rotary motion 1416 between positions that intercept the Neutral Beam 1314 or GCIB 1128 and a parked position indicated by 1414 where the thermal sensor 1402 does not intercept any beam. When thermal sensor 1402 is in the parked position (indicated by 1414) the GCIB 1128 or Neutral Beam 1314 continues along path 1406 for irradiation of the workpiece 1160 and/or workpiece holder 1162. A thermal sensor controller 1420 controls positioning of the thermal sensor 1402 and performs processing of the signal generated by thermal sensor 1402. Thermal sensor 1402 communicates with the thermal sensor controller 1420 through an electrical cable 1418. Thermal sensor controller 1420 communicates with a dosimetry controller 1432 through an electrical cable 1428. A beam current measurement device 1424 measures beam current $I_B$ flowing in electrical lead 1168 when the GCIB 1128 strikes the workpiece 1160 and/or the workpiece holder 1162. Beam current measurement device 1424 communicates a beam current measurement signal to dosimetry controller 1432 via electrical cable 1426. Dosimetry controller 1432 controls setting of open and closed states for beam gate 1172 by control signals transmitted via linkage 1434. Dosimetry controller 1432 controls deflector power supply 1440 via electrical cable 1442 and can control the deflection voltage $V_D$ between voltages of zero and a positive voltage adequate to completely deflect the ionized portion 1316 of the GCIB 1128 to the deflection plate 1304. When the ionized portion 1316 of the GCIB 1128 strikes deflection plate 1304, the resulting current $I_D$ is measured by current sensor 1422 and communicated to the dosimetry controller 1432 via electrical cable 1430. In operation dosimetry controller 1432 sets the thermal sensor 1402 to the parked position 1414, opens beam gate 1172, and sets $V_D$ to zero so that the full GCIB 1128 strikes the workpiece holder 1162 and/or workpiece 1160. The dosimetry controller 1432 records the beam current $I_B$ transmitted from beam current measurement device 1424. The dosimetry controller 1432 then moves the thermal sensor 1402 from the parked position 1414 to intercept the GCIB 1128 by commands relayed through thermal sensor controller 1420. Thermal sensor controller 1420 measures the beam energy flux of GCIB 1128 by calculation based on the heat capacity of the sensor and measured rate of temperature rise of the thermal sensor 1402 as its temperature rises through a predetermined measurement temperature (for example 70 degrees C.) and communicates the calculated beam energy flux to the dosimetry controller 1432 which then calculates a calibration of the beam energy flux as measured by the thermal sensor 1402 and the corresponding beam current measured by the beam current measurement device 1424. The dosimetry controller 1432 then parks the thermal sensor 1402 at parked position 1414, allowing it to cool and commands application of positive $V_D$ to deflection plate 1302 until the entire current $I_D$ due to the ionized portion of the GCIB 1128 is transferred to the deflection plate 1304. The current sensor 1422 measures the corresponding $I_D$ and communicates it to the dosimetry controller 1432. The dosimetry controller also moves the thermal sensor 1402 from parked position 1414 to intercept the Neutral Beam 1314 by commands relayed through thermal sensor controller 420. Thermal sensor controller 420 measures the beam energy flux of the Neutral Beam 1314 using the previously determined calibration factor and the rate of temperature rise of the thermal sensor 1402 as its temperature rises through the predetermined measurement temperature and communicates the Neutral Beam energy flux to the dosimetry controller 1432. The dosimetry controller 1432 calculates a neutral beam fraction, which is the ratio of the thermal measurement of the Neutral Beam 1314 energy flux to the thermal measurement of the full GCIB 1128 energy flux at sensor 1402. Under typical operation, a neutral beam fraction of from about 5% to about 95% is achieved. Before beginning processing, the dosimetry controller 1432 also measures the current, $I_D$, and determines a current ratio between the initial values of $I_B$ and $I_D$. During processing, the instantaneous $I_D$ measurement multiplied by the initial $I_B/I_D$ ratio may be used as a proxy for continuous measurement of the $I_B$ and employed for dosimetry during control of processing by the dosimetry controller 1432. Thus the dosimetry controller 1432 can compensate any beam fluctuation during workpiece processing, just as if an actual beam current measurement for the full GCIB 1128 were available. The dosimetry controller uses the neutral beam fraction to compute a desired processing time for a particular beam process. During the process, the processing time can be adjusted based on the calibrated measurement of $I_D$ for correction of any beam fluctuation during the process.

FIGS. 5A through 5D show the comparative effects of full and charge separated beams on a workpiece, in this case, a thin gold film. In an experimental setup, a gold film deposited on a silicon substrate was processed by a full GCIB (charged and neutral components), a Neutral Beam (charged components deflected out of the beam), and a deflected beam comprising only charged components. All three conditions are derived from the same initial GCIB, a 30 kV accelerated Ar GCIB. Gas target thickness for the beam path after acceleration was approximately $2 \times 10^{14}$ argon gas atoms per $cm^2$. For each of the three beams, exposures were matched to the total energy carried by the full beam (charged plus neutral) at an ion dose of $2 \times 10^{15}$ gas-cluster ions per $cm^2$. Energy flux rates of each beam were measured using a thermal sensor and process durations were adjusted to ensure that each sample received the same total thermal energy dose equivalent to that of the full (charged plus neutral) GCIB dose.

Figure 5A:
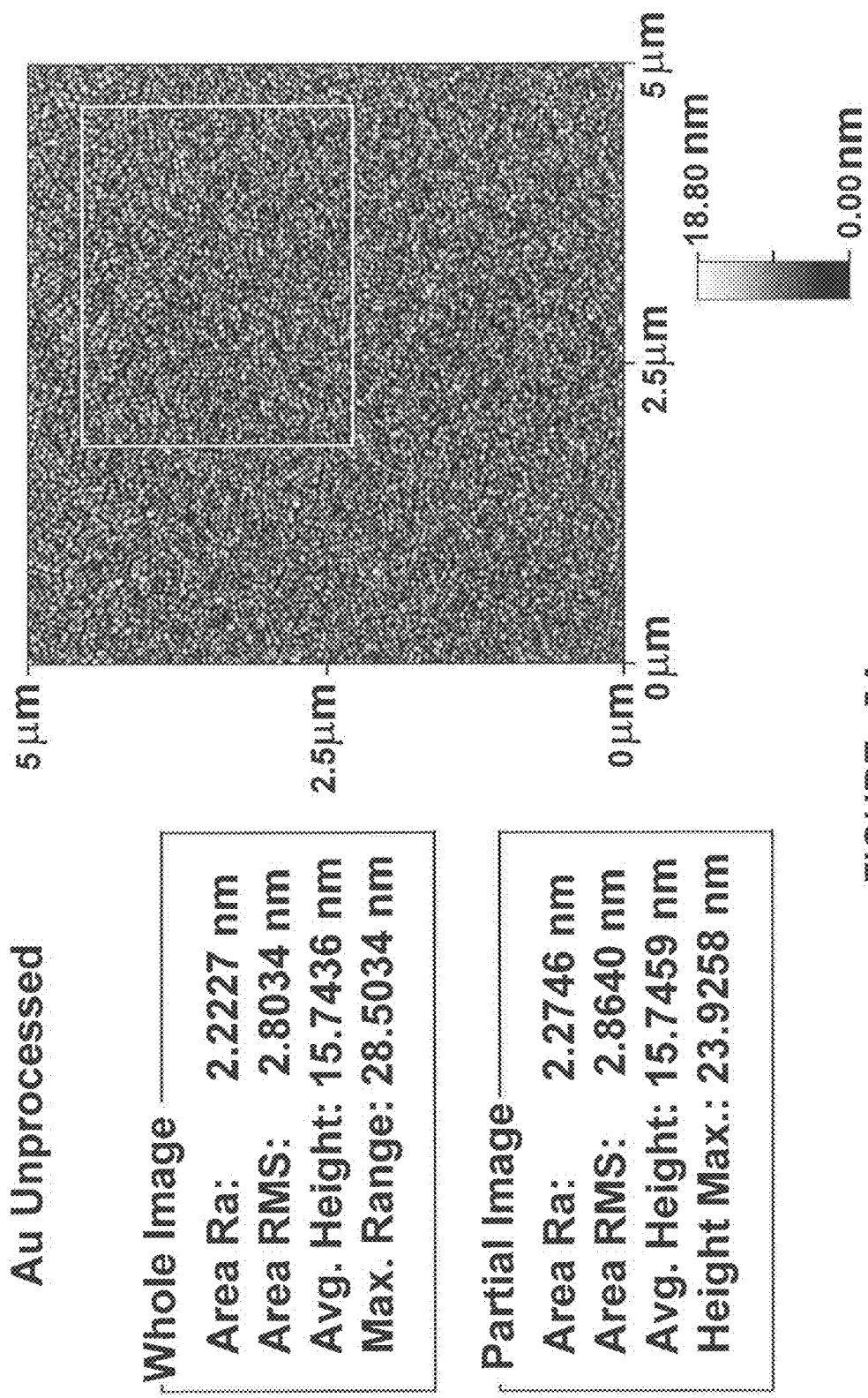
FIGS. 5A, 5B, 5C, and 5D show processing results indicating that processing by a neutral component of a beam produces superior smoothing of the film compared to processing with either a full GCIB or a charged component of the beam.

FIG. 5A shows an atomic force microscope (AFM) 5 micron by 5 micron scan and statistical analysis of an as-deposited gold film sample that had an average roughness, Ra, of approximately 2.22 nm.

Figure 5B:
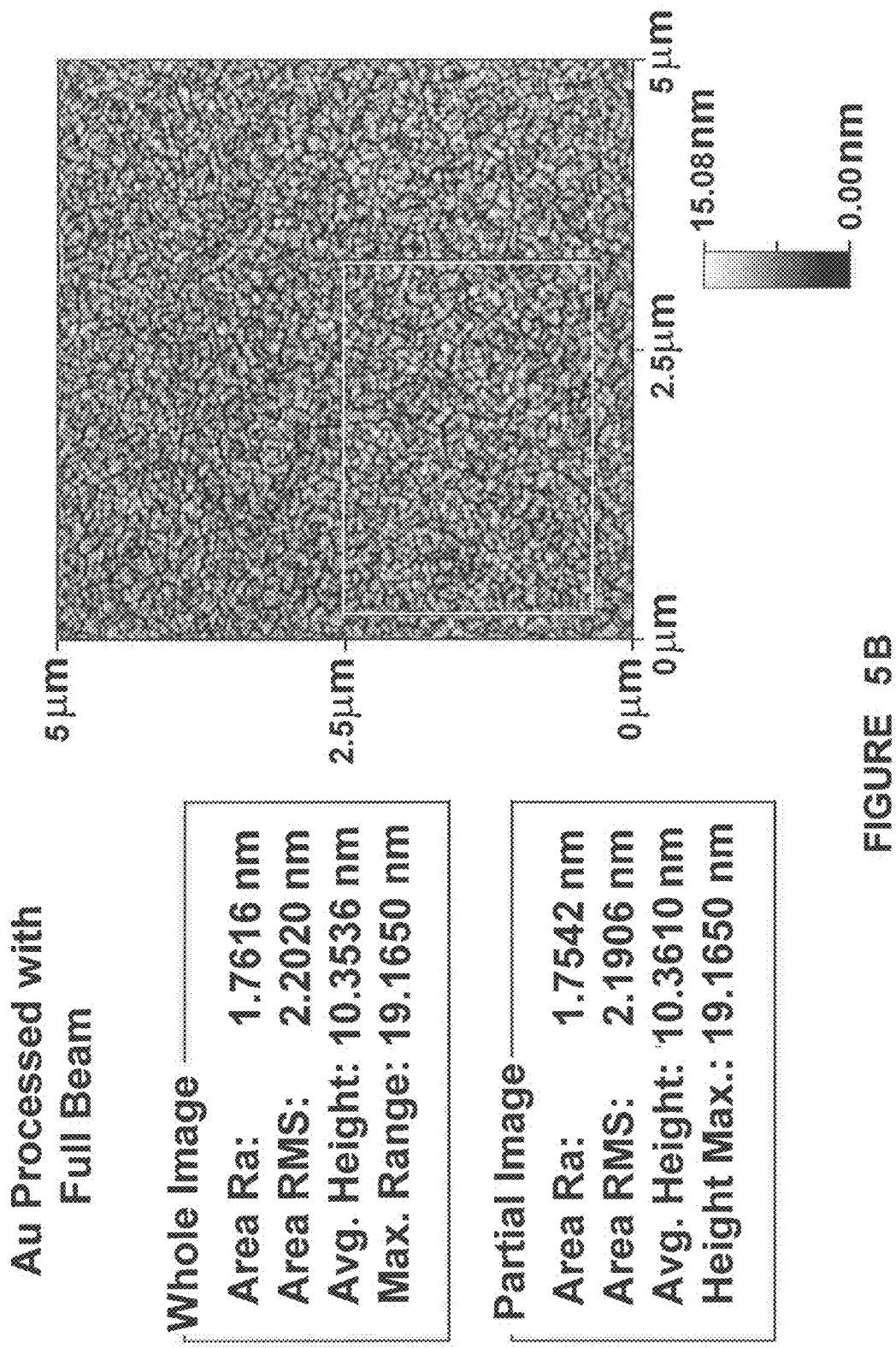

FIG. 5B shows an AFM scan of the gold surface processed with the full GCIB—average roughness, Ra, has been reduced to approximately 1.76 nm.

Figure 5C:
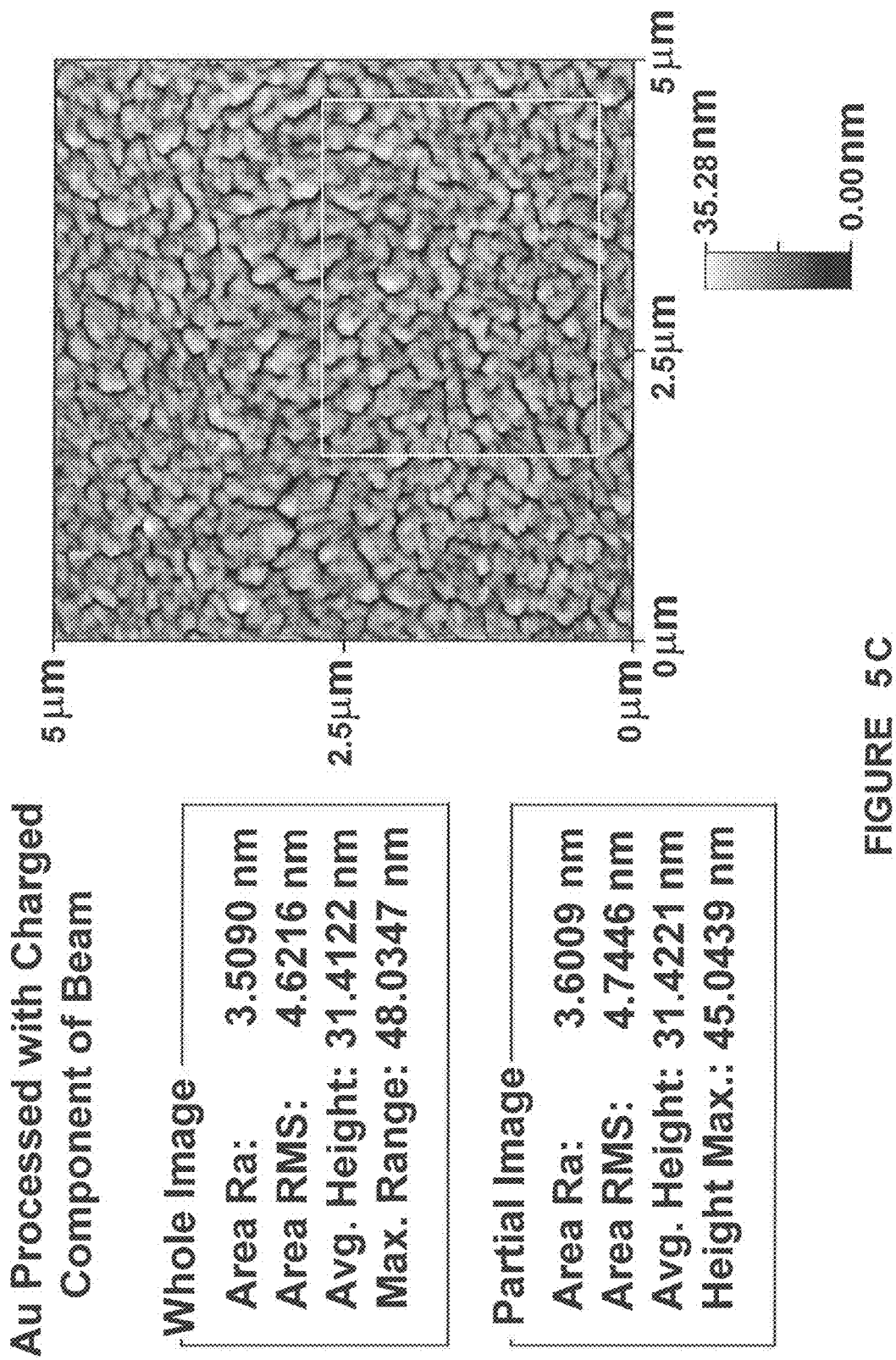

FIG. 5C shows an AFM scan of the surface processed using only charged components of the beam (after deflection from the neutral beam components)—average roughness, Ra, has been increased to approximately 3.51 nm.

Figure 5D:
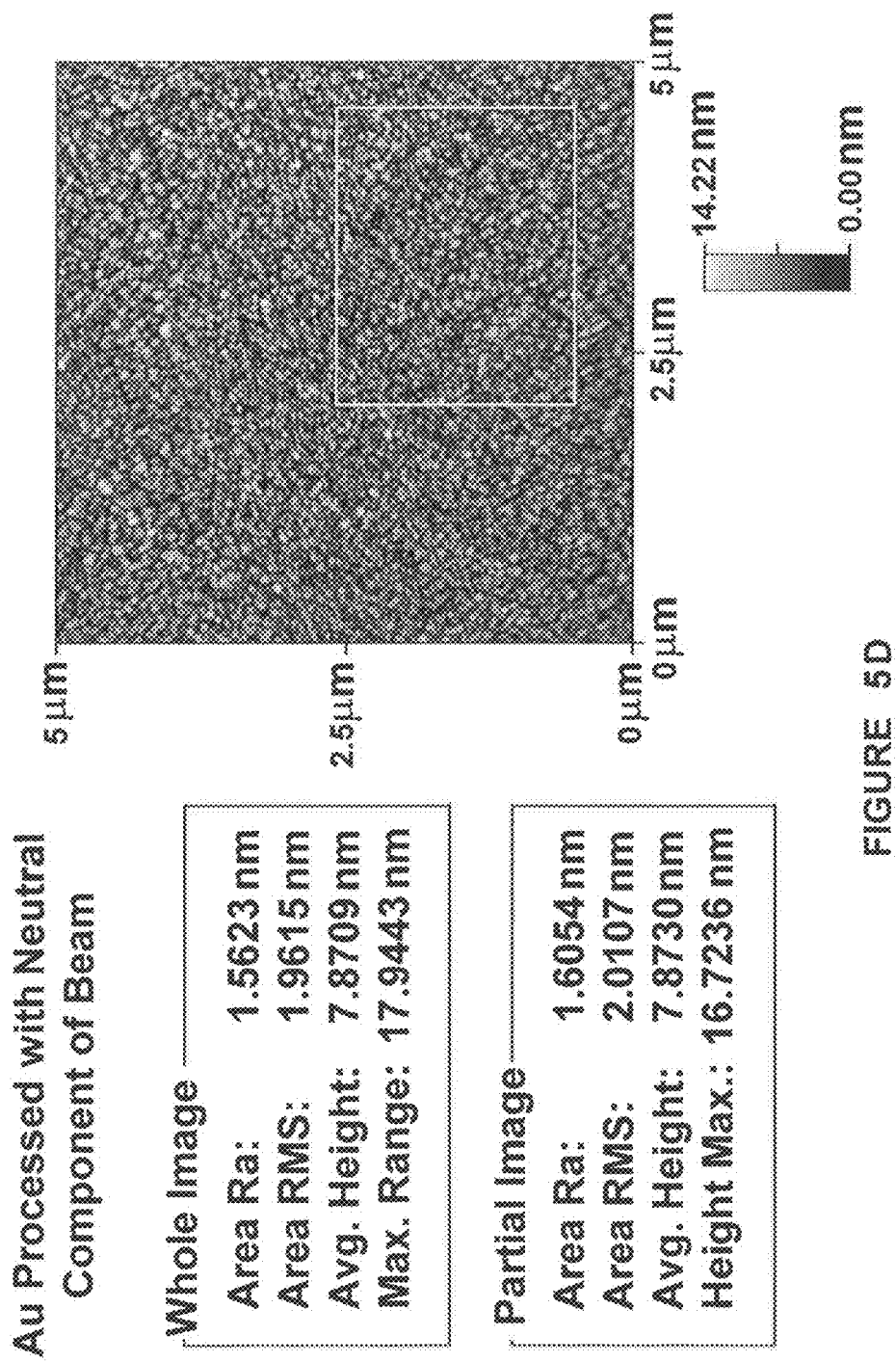

FIG. 5D shows an AFM scan of the surface processed using only the neutral component of the beam (after charged components were deflected out of the Neutral Beam)—average roughness, Ra, is smoothed to approximately 1.56 nm. The full GCIB processed sample (B) is smoother than the as deposited film (A). The Neutral Beam processed sample (D) is smoother than the full GCIB processed sample (B). The sample (C) processed with the charged component of the beam is substantially rougher than the as-deposited film. The results show that the neutral portions of the beam contribute to superior degrees of smoothing compared to a full GCIB, and that the charged components of the beam contribute to roughening.

Figure 6:
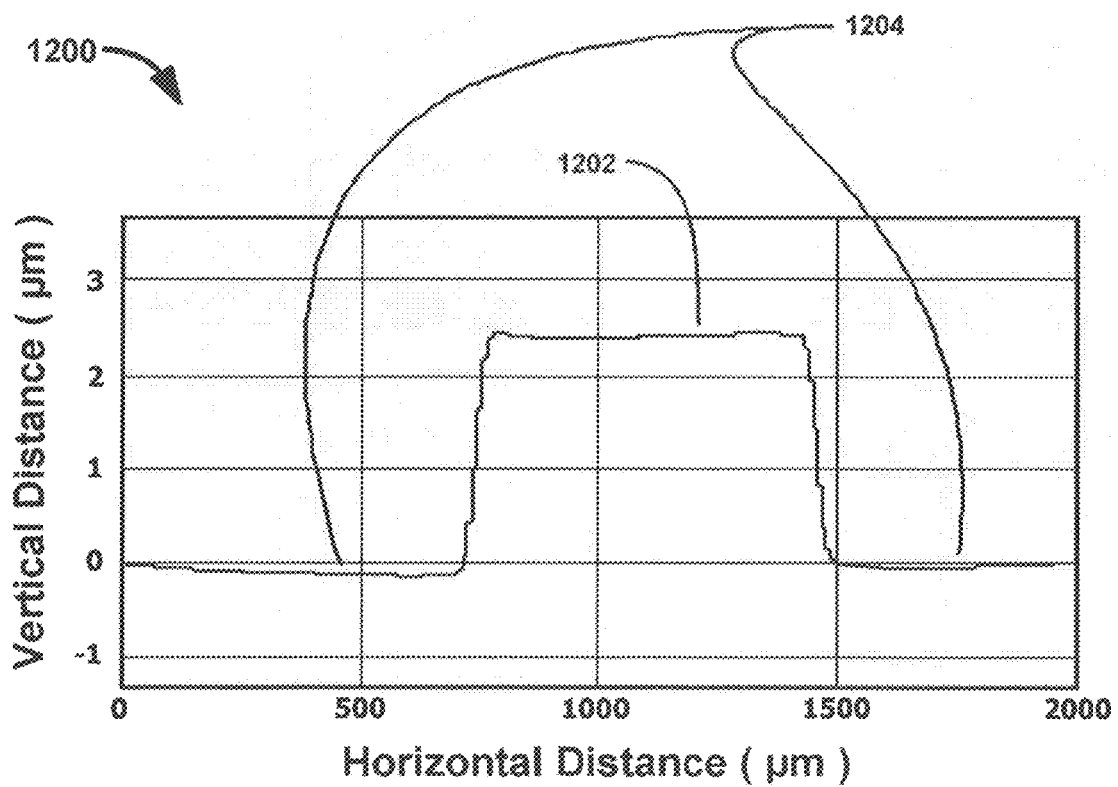
FIG. 6 is a graph illustrating the etching of silica ($SiO_2$) and silicon using a Neutral Beam as may be employed in an embodiment of the invention.

FIG. 6 illustrates a depth profile measurement graph 1200 obtained after using an accelerated Neutral Beam derived from a GCIB to etch a silica (silicon dioxide, $SiO_2$) film on a silicon substrate and to etch the silicon substrate. Using apparatus similar to that shown in FIG. 4, a 30 kV accelerated GCIB was formed using argon. Stagnation chamber pressure was 28 psi ($1.93 \times 10^5$ pascal), nozzle flow was 200 standard $cm^3$/minute (3.3 standard $cm^3$/sec). Full beam current (charged plus neutral components prior to separation by deflection was approximately 0.50 microA (µA). The argon gas target thickness fur the region between the accelerator and the workpiece was approximately $1.49 \times 10^{14}$ argon gas monomers/$cm^2$, and the accelerated Neutral Beam was observed to consist essentially of fully dissociated neutral monomers at the target. Using electrostatic deflection all charged particles were deflected away from the beam axis and out of the beam, forming a Neutral Beam. Thus the Neutral Beam was essentially an accelerated neutral argon monomer beam. Dosimetry was done using a thermal sensor to calibrate the total Neutral Beam dose delivered to the silicon substrate such that a Neutral Beam deposited energy equivalent to that energy which would be deposited by a $2.16 \times 10^{16}$ gas cluster ions/$cm^2$ irradiation dose by an accelerated (30 kV) GCIB including both the charged and uncharged particles (without neutralization by charge separation). A silica film (approximately 0.5 micron [µm] thick) on a silicon substrate was partially masked with a narrow (approximately 0.7 mm wide) strip of polyimide film tape and then irradiated with the accelerated Neutral Beam. Following the irradiation the polyimide tape was removed. Referring again to FIG. 6, the depth profile measurement graph 1200 was generated using a TENCOR Alpha-Step 250 profilometer to measure the step profile, in a direction along the surface of the $SiO_2$ film (on silicon substrate) and across the region masked by the polyimide film tape, due to the etching resulting from the accelerated Neutral Beam. Plateau 1202 represents the unetched surface of the $SiO_2$ film beneath the polyimide film (after film removal and cleaning), while the regions 1204 represent the etched portion. The accelerated Neutral Beam produced an etch depth of approximately 2.4 microns (µm), etching all the way through the 0.5 micron $SiO_2$ film and an additional 1.9 microns into the underlying crystalline silicon substrate, producing the step shown in depth profile measurement graph 1200. The results demonstrate the effectiveness of Neutral Beam etching of silica. Argon and other inert gases may be used as source gases for Neutral Beam etching by physical means.

FIGS. 7A through 7E are schematics showing steps in processing of a photomask substrate, with comparison of conventional processing relative to processing according to an embodiment of the invention.

Figure 7A:
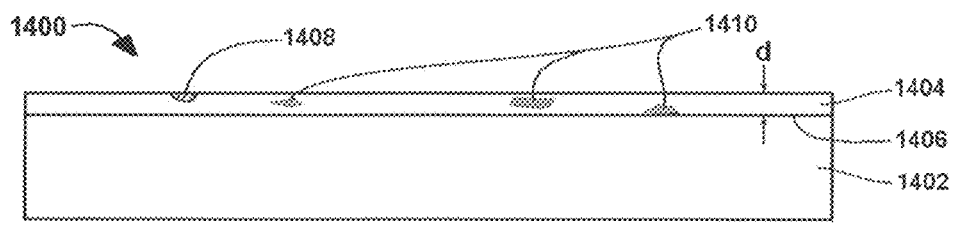
FIGS. 7A through 7E are schematics showing steps in processing of a photomask substrate, with comparison of conventional processing relative to processing according to an embodiment of the invention.

FIG. 7A is a schematic 1400 showing a silica photomask substrate 1402, having detects in an uppermost shallow surface damage region 1404 that may be the result of previous processing such as CMP smoothing/planarizing and/or additional secondary polishing. Such detects may include embedded particles (1408 shown for example) or regions of sub-surface damage (1410 shown as examples). The lower boundary 1406 of the shallow surface damage region 1404 is at a depth, d, below the uppermost surface of the photomask substrate 1402. This figure represents a typical intermediate stage in the processing of a photomask substrate following completion of surface smoothing/Planarizing steps (CMP or CMP plus secondary polishing).

In conventional photomask substrate polishing, billowing the processing stage shown in FIG. 7A, and before proceeding with subsequent conventional steps such as depositions on the substrate, the surface may conventionally be cleaned with an intense agitation wet cleaning process (for example, ultrasonic solvent cavitation) to remove residual polishing slurry or other contaminating particles that could otherwise interfere with successful photomask formation.

Figure 7B:
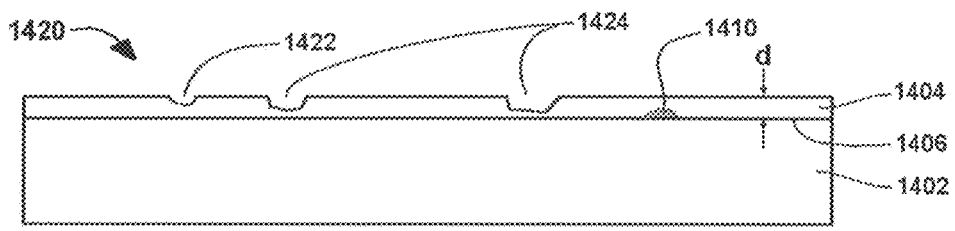

FIG. 7B is a schematic 1420 showing the photomask substrate at a stage following conventional aggressive cleaning (such as with an intense agitation wet cleaning process). The cleaning process has resulted in sonic embedded particles having been released exposing embedded particle pits (1422 shown as an example) and has resulted in some regions of sub-surface damage having migrated to the uppermost surface creating exposed pits and/or depressions (1424 shown as examples). Additional regions of sub-surface damage 1410 may not migrate to create surface pits and/or depressions. Surface defects such as 1422 and 1424 may be so small as to not be detected at this stage of processing and may only manifest themselves at subsequent stages of conventional processing such as following deposition steps or later after considerable additional processing expense has been incurred.

According to an embodiment of the invention, a modified process flow for the photomask substrates may be employed, such that following the conventional stage shown in FIG. 7A, and before any aggressive cleaning step that may result in appearance of surface defects, the surface is processed using a Neutral Beam to etch away a predetermined depth of the uppermost surface of the photomask substrate to a depth greater than or equal to depth d, including the lower boundary of the surface damage 1406 and the a shallow surface damage region 1404. This requires determining the depth, d, of the shallow surface damage region 1404, which may be dependent on the previous CMP and/or secondary polishing processing processes and on the substrate material. It also requires determining Neutral Beam irradiation beam parameters (such beam acceleration, source gas selection for etching, and Neutral Beam dose) as well as the etchability characteristics of the substrate material. The depth, d, has typically been observed to be on the order of from about ten nanometers to as much as several hundred nanometers. Neutral Beam process parameters may be typically be selected to be argon source gas, 30 kV acceleration potential $V_{Acc}$, and with a dose previously determined to produce the desired etch depth equal to or exceeding the depth, d in the substrate material. Conventional process development techniques can be used to determine depth, d, and the corresponding required etching depth as a function substrate material and of Neutral Beam dose for a specific set of beam conditions.

Figure 7C:
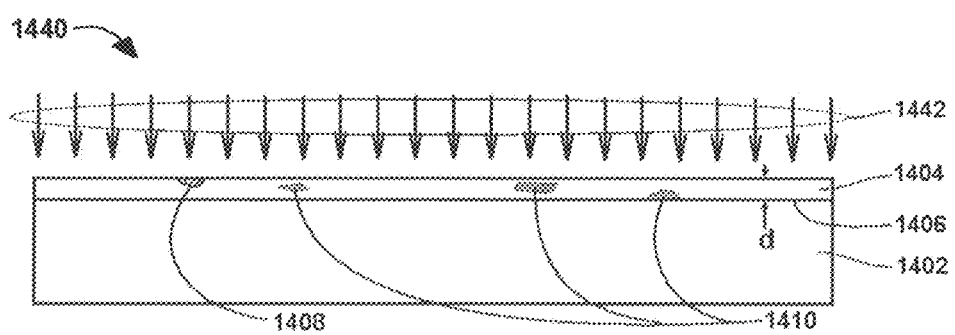

FIG. 7C is a schematic 1440 showing a Neutral Beam etching step following the conventional processing state shown in FIG. 7.A, according to an embodiment of the invention, wherein a Neutral Beam etching step is used to remove the damage region prior to any intense agitation wet cleaning process (for example, ultrasonic solvent cavitation) or other aggressive cleaning step. A Neutral Beam 1442 is irradiated onto the surface of the photomask substrate 1402 using beam conditions (for example argon source gas, 30 kV acceleration potential, $V_{Acc}$) with a predetermined dose sufficient to etch away at least all of the shallow surface damage region 1404. The etching step removes embedded particles 1408, regions of sub-surface damage 1410 and other substrate material down to a depth at least as deep as d. Because Neutral Beam etching does not produce mechanical stresses like CMP, it does not introduce new sub-surface damage, and because the beam is not charged, it does not tend to create sub-surface defects due to electrical charging effects as may occur with ion beam or plasma etching.

Figure 7D:
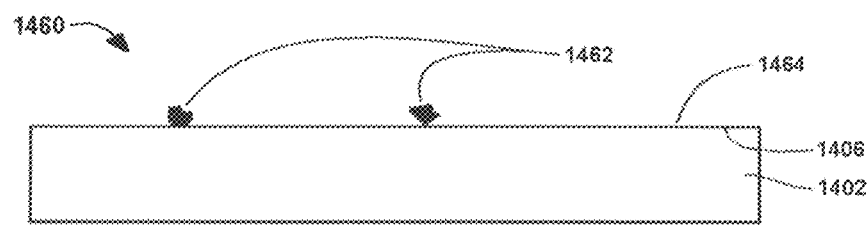

FIG. 7D is a schematic 1460 showing the state of the photomask substrate 1402, following the etching step shown in FIG. 7C according to an embodiment of the invention. The original shallow subsurface damage region has been completely etched away by Neutral Beam irradiation. The upper surface 1464 of the photomask substrate 1402 coincides with (or optionally is even beneath) the original lower boundary 1406 of the original shallow sub-surface damage region. Residual particles (1462 shown as examples) of contamination left from the etching process or other handling may be present on the upper surface 1464.

Following the state shown in FIG. 7D, according to an embodiment of the invention, a conventional aggressive cleaning step (such as with an intense agitation wet cleaning process) is employed to clean the surface of any residual particles 1462. Since there are no longer any embedded particles nor any sub-surface damage regions, aggressive cleaning can be employed without introducing pits or depressions in the upper surface 1464 of the photomask substrate 1402.

Figure 7E:
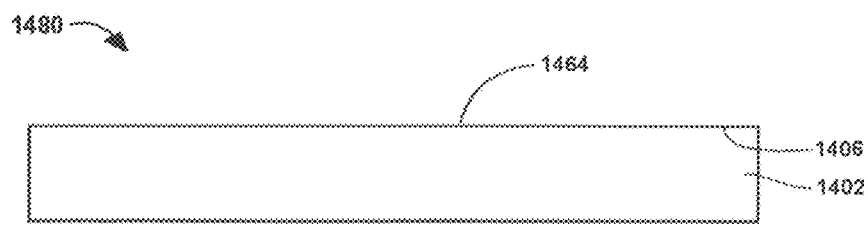

FIG. 7E is a schematic 1480 showing the photomask substrate following processing according to the modified workflow of the invention, which includes the step using a Neutral Beam to etch away the original shallow sub-surface damage region before subsequent cleaning. The photomask substrate 1402 has an upper surface 1464 that is free of pits and depressions and is clean and free of particulate contamination. It is ready for additional conventional photomask processing including for example, deposition and patterning.

Although the invention has been described, for exemplary purposes, as using a Neutral Beam derived from a GCIB for processing a surface of a fused silica photomask substrate, it is understood by the inventors that benefits obtained by application of such surface processing is not limited to that specific material and that the invention may be used for successful processing of other photomask substrate materials and other materials such as ceramics, polymers, glass, metals, etc., and it is intended that all such applications are included within the scope of the invention. Additionally, it is understood by the inventors that the invention is suitable for producing high quality surfaces in applications other than photomask substrates, as in other optical devices, and to mitigate problems with other materials and devices where surface defect initiation results from a subsurface defect region that may further propagate defects during periods of thermal shock, mechanical agitation, aqueous or chemical treatment, stress initiation from additional coatings applied to the surface, etc., and it is intended that all such materials and applications are included within the scope of the invention. Although the invention has been described with respect to elimination of latent damage resulting from CMP processing, it is understood by the inventors that the invention capable of eliminating latent damage resulting from diamond turning processes, abrasive grinding, or other processes that produce latent sub-surface damage or that embed releasable particles into a critical surface, and it is intended that all such applications are included within the scope of the invention. Although the invention has been described with respect to various embodiments, it should be realized that this invention is also capable of a wide variety of further and other embodiments within the spirit and scope of the invention and the appended claims.

What is claimed is:
1. A method of treating a surface of a substrate that contains one or more embedded particles or contains sub-surface damage, comprising the steps of:
providing a reduced pressure chamber;
forming a gas-cluster ion-beam comprising gas-cluster ions within the reduced pressure chamber;
accelerating and focusing the gas-cluster ions to form an accelerated and focused gas-cluster ion-beam along a beam path within the reduced pressure chamber;
promoting fragmentation and/or dissociation of at least a portion of the accelerated and focused gas-cluster ions along the beam path, including irradiating the accelerated gas cluster ion beam or the neutral beam with radiant energy;
removing charged particles from the beam path to form an accelerated and focused neutral beam along the beam path in the reduced pressure chamber;
holding the surface in the beam path; and treating at least a portion of the surface of the substrate by irradiating it with the accelerated and focused neutral beam.

2. The method of claim 1, further comprising prior processing of the substrate resulting in the one or more embedded particles or sub-surface damage.

3. The method of claim 1, wherein the prior processing step is a smoothing or polishing or planarizing operation.

4. The method of claim 3, wherein the smoothing or polishing or planarizing operation is a CMP process.

5. The method of claim 3, wherein the subsurface damage is latent damage.

6. The method of claim 2, wherein the prior processing step is a diamond turning or abrasive grinding operation.

7. The method of claim 6, wherein the damage is latent damage.

8. The method of claim 1, wherein the treating step irradiates the portion of the surface to a dose sufficient to etch away a predetermined thickness sufficient to remove one or more embedded particles or sub-surface damage.

9. The method of claim 8, further comprising cleaning the treated portion to remove one or more residual particles.

10. The method of claim 1, wherein the one or more residual particles are contamination resulting from the treating step.

11. The method of claim 1, wherein the step of promoting includes raising an acceleration voltage in the step of accelerating or improving ionization efficiency in the forming of the gas cluster ion beam.

12. The method of claim 1, wherein the step of promoting includes increasing the range of velocities of ions in the accelerated gas cluster ion beam.

13. The method of claim 1, wherein the step of promoting includes introducing one or more gaseous elements used in forming the gas cluster ion beam into the reduced pressure chamber to increase pressure along the beam path.

14. A method of treating a surface of a substrate that contains one or more embedded particles or contains sub-surface damage, comprising the steps of:
providing a reduced pressure chamber;
forming a gas-cluster ion-beam comprising gas-cluster ions within the reduced pressure chamber;
accelerating and focusing the gas-cluster ions to form an accelerated and focused gas-cluster ion-beam along a beam path within the reduced pressure chamber;
promoting fragmentation and/or dissociation of the accelerated and focused gas-cluster ions along the beam path while substantially retaining the focus of the gas cluster ion-beam;
removing charged particles from the beam path to form an accelerated and focused neutral beam along the beam path in the reduced pressure chamber;
holding the surface in the beam path;
treating at least a portion of the surface of the substrate by irradiating it with the accelerated and focused neutral beam; and
wherein the step of promoting includes increasing the size of a skimmer aperture used in the step of forming the gas cluster ion beam.

15. A method of treating a surface of a substrate that contains one or more embedded particles or contains sub-surface damage, comprising the steps of:
providing a reduced pressure chamber;
forming a gas-cluster ion-beam comprising gas-cluster ions within the reduced pressure chamber;
accelerating and focusing the gas-cluster ions to form an accelerated and focused gas-cluster ion-beam along a beam path within the reduced pressure chamber;
promoting fragmentation and/or dissociation of the accelerated and focused gas-cluster ions along the beam path while substantially retaining the focus of the gas cluster ion-beam;
removing charged particles from the beam path to form an accelerated and focused neutral beam along the beam path in the reduced pressure chamber;
holding the surface in the beam path;
treating at least a portion of the surface of the substrate by irradiating it with the accelerated and focused neutral beam; and
wherein the step of promoting includes irradiating the accelerated gas cluster ion beam or the neutral beam with radiant energy.

16. The method of claim 1, wherein the neutral beam treating at least a portion of a surface of the workpiece consists substantially of monomers having energies between 1 eV and several thousand eV.

17. The method of claim 1, further comprising the step of scanning the workpiece with a workpiece holder to treat extended portions of the surface.

18. The method of claim 1, where the holding step introduces the substrate that comprises any of:
an optical material;
a ceramic material;
a glass material;
a metal material; or
silica.

19. The method of claim 1, wherein the substrate is a lithography photomask substrate.

20. An article made by the process of claim 1.

21. A lithography photomask comprising a surface treated by the method of claim 1.

22. A method of treating a surface of a substrate that contains one or more embedded particles or contains sub-surface damage, comprising the steps of:
providing a reduced pressure chamber;
forming a gas-cluster ion-beam comprising gas-cluster ions within the reduced pressure chamber;
accelerating and focusing the gas-cluster ions to form an accelerated and focused gas-cluster ion-beam along a beam path within the reduced pressure chamber;
promoting fragmentation and/or dissociation of at least a portion of the accelerated and focused gas-cluster ions along the beam path, including increasing the size of a skimmer aperture used in the step of forming the gas cluster ion beam;
removing charged particles from the beam path to form an accelerated and focused neutral beam along the beam path in the reduced pressure chamber;
holding the surface in the beam path; and
treating at least a portion of the surface of the substrate by irradiating it with the accelerated and focused neutral beam.

* * * * *